(12) United States Patent
Hoekerd et al.

(10) Patent No.: US 8,432,531 B2
(45) Date of Patent: Apr. 30, 2013

(54) LITHOGRAPHIC APPARATUS AND A METHOD OF OPERATING THE APPARATUS

(75) Inventors: Kornelis Tijmen Hoekerd, Eindhoven (NL); Roelof Frederik De Graaf, Veldhoven (NL); Hans Jansen, Eindhoven (NL); Martinus Hendrikus Antonius Leenders, Rhoon (NL); Antonius Johannus Van Der Net, Tilburg (NL); Pieter Jacob Kramer, Veldhoven (NL); Anthonie Kuijper, Best (NL); Arjan Hubrecht Josef Anna Martens, Valkenburg (NL); Sandra Van Der Graaf, 's-Hertogenbosch (NL); Alexandre Viktorovych Padiy, Geldrop (NL)

(73) Assignee: ASML Netherlands B.V., Veldhoven (NL)

(*) Notice: Subject to any disclaimer, the term of this patent is extended or adjusted under 35 U.S.C. 154(b) by 323 days.

(21) Appl. No.: 12/893,875

(22) Filed: Sep. 29, 2010

(65) Prior Publication Data
US 2011/0080567 A1    Apr. 7, 2011

Related U.S. Application Data

(60) Provisional application No. 61/326,045, filed on Apr. 20, 2010, provisional application No. 61/267,718, filed on Dec. 8, 2009, provisional application No. 61/248,343, filed on Oct. 2, 2009.

(51) Int. Cl.
*G03B 27/42* (2006.01)
*G03B 27/52* (2006.01)

(52) U.S. Cl.
USPC .............................................. 355/53; 355/30

(58) Field of Classification Search ............... 355/30, 355/53, 67; 366/152.1, 160.2
See application file for complete search history.

(56) References Cited

U.S. PATENT DOCUMENTS

| | | | |
|---|---|---|---|
| 4,509,852 A | 4/1985 | Tabarelli et al. | |
| 7,029,164 B2 * | 4/2006 | Linsen et al. | 366/152.1 |
| 7,148,949 B2 | 12/2006 | Teunissen et al. | |
| 7,852,456 B2 * | 12/2010 | Nagasaka | 355/30 |
| 2004/0105080 A1 | 6/2004 | Teunissen et al. | |
| 2004/0136494 A1 | 7/2004 | Lof et al. | |
| 2004/0207824 A1 | 10/2004 | Lof et al. | |
| 2006/0038968 A1 | 2/2006 | Kemper et al. | |
| 2006/0119809 A1 | 6/2006 | Verhagen et al. | |

(Continued)

FOREIGN PATENT DOCUMENTS

| | | |
|---|---|---|
| CN | 101354538 | 1/2009 |
| CN | 101410948 | 4/2009 |

(Continued)

OTHER PUBLICATIONS

Korean Office Action dated Jul. 12, 2012 in corresponding Korean Patent Application No. 10-2010-0096052.

(Continued)

*Primary Examiner* — Hung Henry Nguyen
(74) *Attorney, Agent, or Firm* — Pillsbury Winthrop Shaw Pittman LLP

(57) ABSTRACT

A cleaning liquid supply system is disclosed. The cleaning liquid supply system may supply an emulsified cleaning liquid to clean an immersion lithographic apparatus. A lithographic apparatus is also disclosed.

20 Claims, 11 Drawing Sheets

U.S. PATENT DOCUMENTS

| | | |
|---|---|---|
| 2006/0158627 A1 | 7/2006 | Kemper et al. |
| 2008/0156356 A1* | 7/2008 | Nagasaka et al. ......... 134/115 R |
| 2008/0212046 A1 | 9/2008 | Riepen et al. |
| 2008/0304034 A1* | 12/2008 | Ockwell et al. ................. 355/67 |
| 2009/0025753 A1 | 1/2009 | De Jong et al. |
| 2009/0027636 A1 | 1/2009 | Leenders et al. |
| 2009/0195761 A1 | 8/2009 | De Graaf et al. |
| 2009/0279060 A1 | 11/2009 | Direcks et al. |
| 2010/0060868 A1 | 3/2010 | Tanasa et al. |
| 2010/0097587 A1 | 4/2010 | De Jong et al. |

FOREIGN PATENT DOCUMENTS

| | | |
|---|---|---|
| EP | 1 420 300 | 5/2004 |
| JP | 06-194837 | 7/1994 |
| JP | 2004-282014 | 10/2004 |
| JP | 2007-150102 | 6/2007 |
| JP | 2009-076904 | 4/2009 |
| JP | 2009-177143 | 8/2009 |
| KR | 10-2008-0018158 | 2/2008 |
| WO | 99/49504 | 9/1999 |
| WO | 2005/064405 | 7/2005 |
| WO | 2006/137410 | 12/2006 |

OTHER PUBLICATIONS

Japanese Office Action mailed Apr. 23, 2012 in corresponding Japanese Patent Application No. 2010-212952.

Susen Oliczewski et al., "A Novel Fiber-Optic Photometer for in Situ Stability Assessment of Concentrated Oil-in-Water Emulsions", AAPS PharmSciTech 2007; 8 (3) Article 70, Aug. 31 2007 (E1-E7).

Chinese Office Action dated Sep. 5, 2012 in corresponding Chinese Patent Application No. 201010501461.9.

Bauke Jansen et al., U.S. Appl. No. 12/788,575, filed May 12, 2010, Specifications, Drawings Enclosed.

* cited by examiner

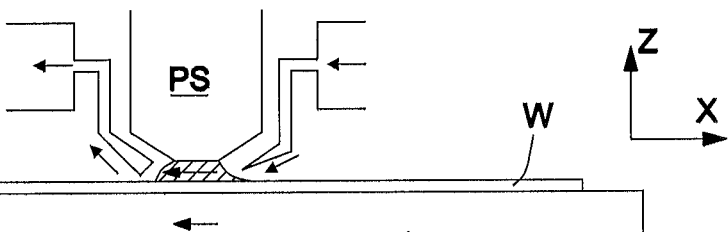
- PRIOR ART -
FIG. 2
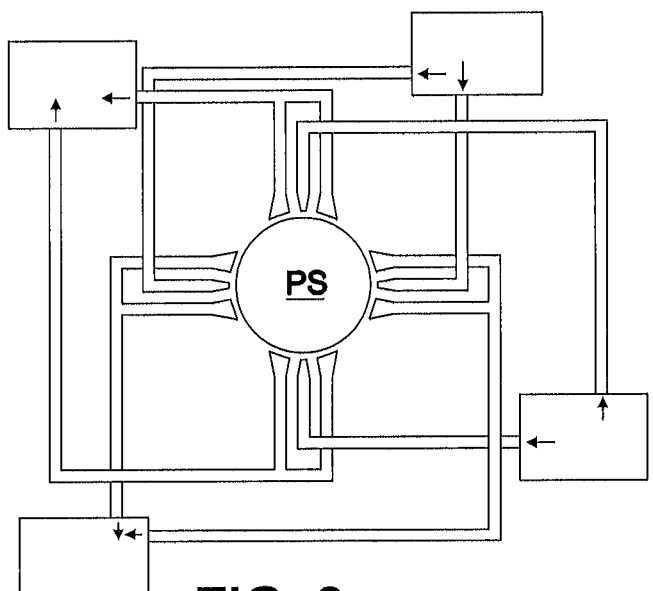
- PRIOR ART -
FIG. 3
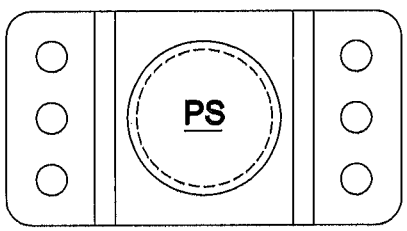
- PRIOR ART -
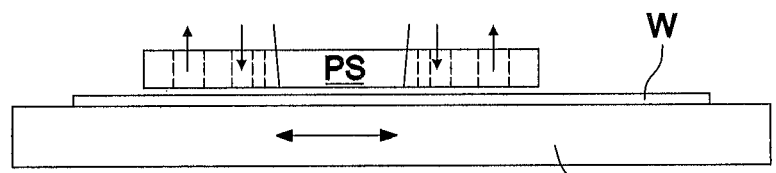
FIG. 4

- PRIOR ART -

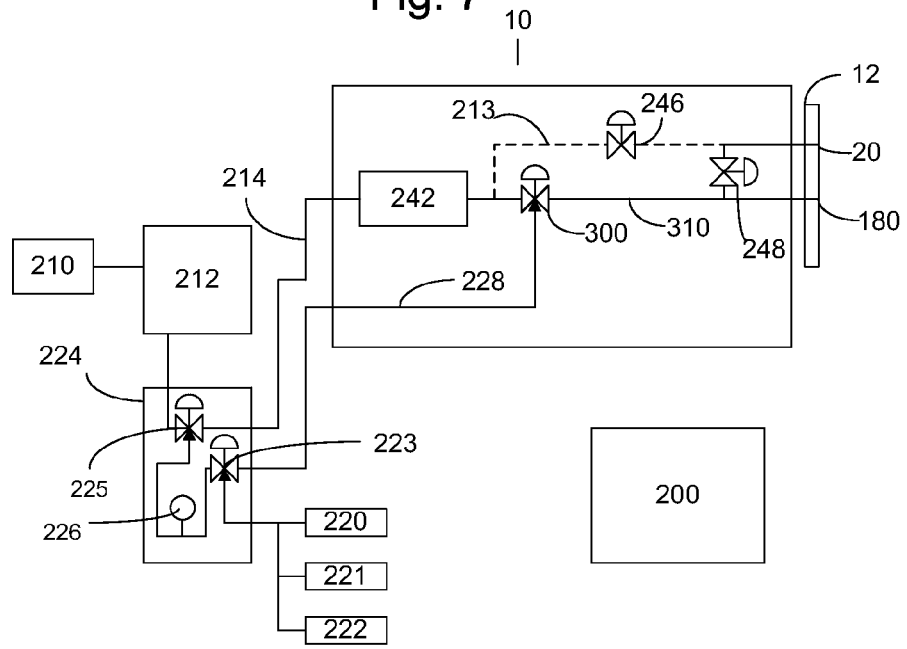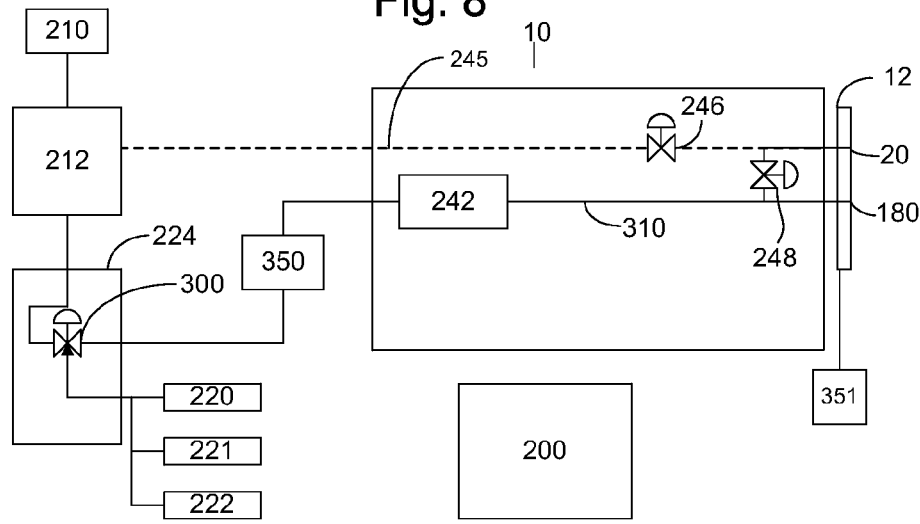

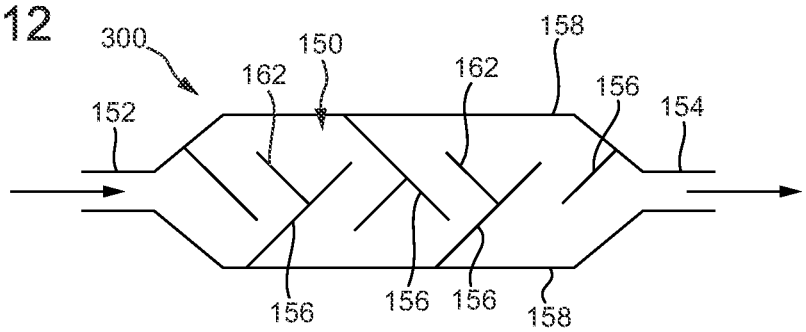
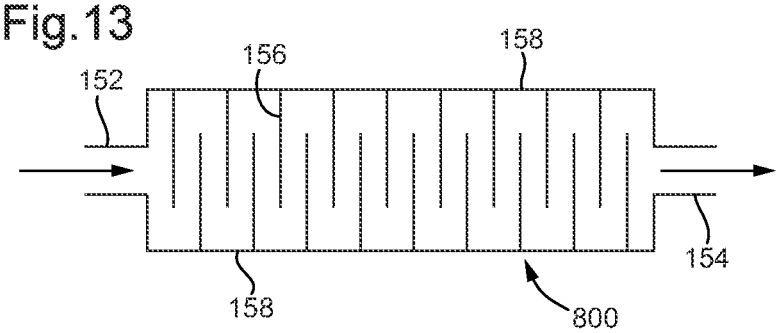
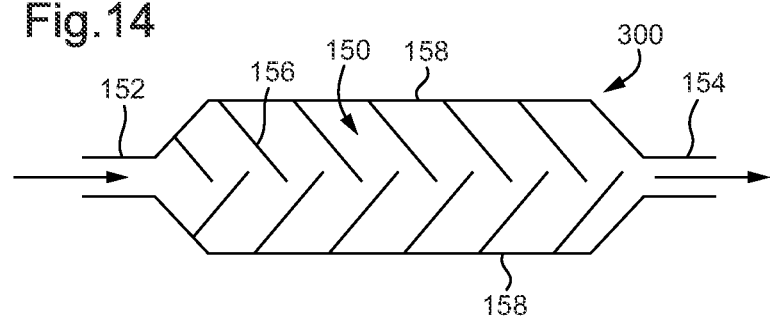
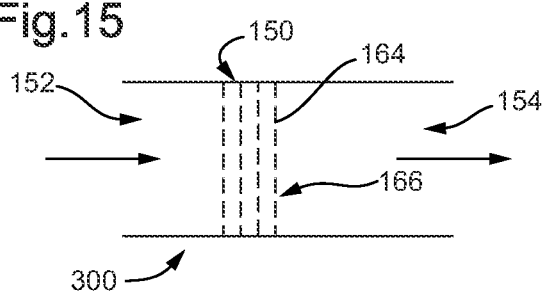

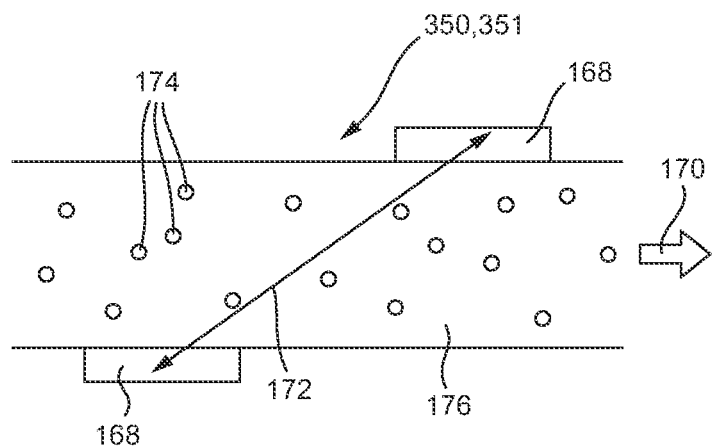
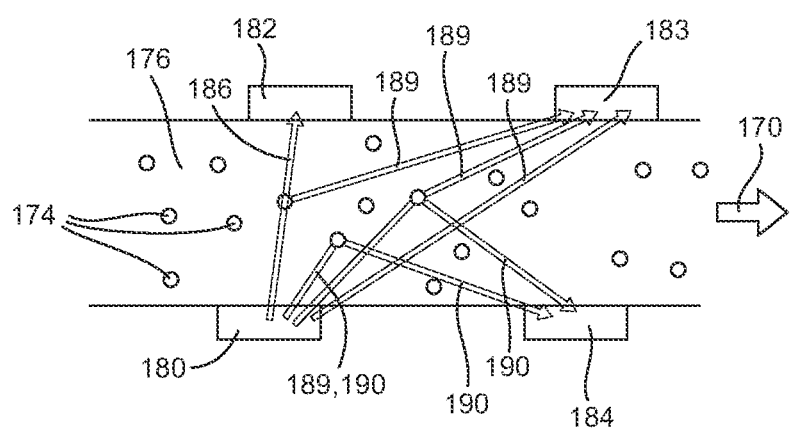

LITHOGRAPHIC APPARATUS AND A METHOD OF OPERATING THE APPARATUS

This application claims priority and benefit under 35 U.S.C. §119(e) to U.S. Provisional Patent Application No. 61/248,343, entitled "Lithographic Apparatus and a Method of Operating the Apparatus", filed on Oct. 2, 2009, to U.S. Provisional Patent Application No. 61/267,718, entitled "Lithographic Apparatus and a Method of Operating the Apparatus", filed on Dec. 8, 2009, and to U.S. Provisional Patent Application No. 61/326,045, entitled "Lithographic Apparatus and a Method of Operating the Apparatus", filed on Apr. 20, 2010. The contents of each of the foregoing applications is incorporated herein in its entirety by reference.

FIELD

The present invention relates to an immersion lithographic apparatus and a method of maintaining the cleanliness of an immersion apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the present invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

Submersing the substrate or substrate and substrate table in a bath of liquid (see, for example, U.S. Pat. No. 4,509,852) means that there is a large body of liquid that should be accelerated during a scanning exposure. This may require additional or more powerful motors and turbulence in the liquid may lead to undesirable and unpredictable effects.

In an immersion apparatus, immersion fluid is handled by a fluid handling system, structure or apparatus. In an embodiment the fluid handling system may supply immersion fluid and therefore be a fluid supply system. In an embodiment the fluid handling system may at least partly confine immersion fluid and thereby be a fluid confinement system. In an embodiment the fluid handling system may provide a barrier to immersion fluid and thereby be a barrier member, such as a fluid confinement structure. In an embodiment the fluid handling system may create or use a flow of gas, for example to help in controlling the flow and/or the position of the immersion fluid. The flow of gas may form a seal to confine the immersion fluid so the fluid handling structure may be referred to as a seal member; such a seal member may be a fluid confinement structure. In an embodiment, immersion liquid is used as the immersion fluid. In that case the fluid handling system may be a liquid handling system. In reference to the aforementioned description, reference in this paragraph to a feature defined with respect to fluid may be understood to include a feature defined with respect to liquid.

In European patent application publication no. EP 1420300 and United States patent application publication no. US 2004-0136494, each hereby incorporated in their entirety by reference, the idea of a twin or dual stage immersion lithography apparatus is disclosed. Such an apparatus is provided with two tables for supporting a substrate. Levelling measurements are carried out with a table at a first position, without immersion liquid, and exposure is carried out with a table at a second position, where immersion liquid is present. In an arrangement, the apparatus has two tables, one of which is configured to support a substrate and may be referred to as a substrate table. The other table may be referred to as a measurement table and may support a sensor, for example to sense a property of the projection system and/or a cleaning component. In another arrangement, the apparatus has only one table.

After exposure of a substrate in an immersion lithographic apparatus, the substrate table is moved away from its exposure position to a position in which the substrate may be removed and replaced by a different substrate. This is known as substrate swap. In a two stage lithographic apparatus, the substrate tables swap may take place under the projection system.

PCT patent application publication WO 2005/064405 discloses an all wet arrangement in which the immersion liquid is unconfined. In such a system the whole top surface of the substrate is covered in liquid. This may be advantageous because then the whole top surface of the substrate is exposed to the substantially same conditions. This may have an advantage for temperature control and processing of the substrate. In WO 2005/064405, a liquid supply system provides liquid to the gap between the final element of the projection system and the substrate. That liquid is allowed to leak over the remainder of the substrate. A barrier at the edge of a substrate table prevents the liquid from escaping so that it can be removed from the top surface of the substrate table in a controlled way. Although such a system improves temperature control and processing of the substrate, evaporation of the immersion liquid may still occur. One way of helping to alleviate that problem is described in United States patent application publication no. US 2006/0119809. A member is provided which covers the substrate W in all positions and which is arranged to have immersion liquid extending between it and the top surface of the substrate and/or substrate table which holds the substrate.

In a fluid handling system or liquid confinement structure, liquid is confined to a space, for example within a confinement structure by the body of the structure, the underlying surface (e.g. a substrate table, a substrate supported on the substrate table, a shutter member and/or a measurement table) and, in the case of a localized area immersion system, a liquid meniscus between the fluid handling system or liquid confinement structure and the underlying structure i.e. in an immersion space. In the case of an all wet system, liquid is allowed to flow out of the immersion space onto the top surface of the substrate and/or substrate table.

SUMMARY

There is a need to address the problem of contamination in a lithographic apparatus. Contamination may, for example, be generated by removal of particles of top-coat material, resist or both and/or future process materials including BARC. There are different types of contamination and the degree to which the lithographic apparatus should be cleaned and the type of cleaner that should be used may depend on the type of contamination that is present.

One proposed cleaning liquid comprises or consists of a base liquid, which may the same as the immersion liquid and may be water, with an at least partially immiscible component. The cleaning liquid may be used as an emulsion with the component present as a solute in the base liquid and present in substantially pure form as droplets suspended in the base liquid. The component is therefore present as a liquid (i.e. component liquid) separate from the base liquid as well as a solute in the base liquid.

In using a cleaning liquid which is an emulsion it may be important to ensure that the proportions between the base liquid and the partially immiscible component liquid is in a desired working range such that the cleaning liquid is an emulsion so that the cleaning may be effected, but the proportion of the cleaning liquid which is the at least partially immiscible component is not so large that damage may be caused to a surface of the immersion system.

It is therefore desirable, for example, to at least alleviate the aforementioned problem, for example by providing a fluid supply system to help ensure that the cleaning liquid is supplied to the immersion system to be cleaned in the desired working range of proportions of the base liquid and the emulsified component.

In an aspect, there is provided immersion lithographic apparatus comprising: a projection system; a liquid confinement structure configured at least partly to confine immersion liquid to an immersion space defined by the projection system, the liquid confinement structure and a substrate and/or substrate table; a liquid supply device comprising a mixer configured to mix liquid from a first liquid source with an active cleaning agent liquid from a second liquid source to form an emulsified cleaning fluid, and a conduit configured to provide emulsified cleaning fluid from the mixer to the liquid confinement structure, the emulsified cleaning fluid comprising a first liquid component and a second liquid component; a sensor system configured to sense a property of the emulsified cleaning fluid; and a controller configured to control the supply of liquid from the first liquid source and/or the second liquid source to the mixer in order to control a property of the emulsified cleaning fluid.

In an embodiment, the liquid supply device comprises the first liquid source and/or the second liquid source.

In an aspect, there is provided a fluid supply apparatus configured to supply an emulsified cleaning fluid to an immersion lithographic apparatus, the fluid supply apparatus comprising a mixer configured to mix an additive fluid from an additive fluid supply and an immersion liquid from an immersion liquid supply to form the emulsified cleaning fluid, a sensor system configured to sense a physical property of the emulsified cleaning fluid and a controller connected to the sensor and the mixer, the controller configured to control: supply of the additive fluid from the additive fluid supply to the mixer; and a physical property of the emulsified cleaning fluid.

In an embodiment, the liquid supply device comprises the additive fluid supply and/or the immersion liquid supply.

In an aspect, there is provided a fluid supply apparatus configured to supply a cleaning emulsion fluid to an immersion lithographic apparatus, the fluid supply apparatus comprising a mixer configured to mix a cleaning component and a base liquid to provide the cleaning emulsion fluid, a sensor configured to sense a concentration of the proportion of the cleaning component in the cleaning emulsion fluid and a controller connected to the sensor and the mixer, the controller configured to control: supply of the cleaning component to the mixer; and the concentration of the cleaning component in the cleaning emulsion fluid.

In an embodiment, the liquid supply device comprises an cleaning component supply and/or a base liquid supply.

In an aspect, there is provided an immersion lithographic apparatus comprising a liquid supply device comprising a mixer configured to mix a first liquid with an active cleaning agent liquid to form an emulsified cleaning fluid in which the mixer is a passive mixer configured to maintain a droplet size of the active cleaning agent liquid to be within a certain range.

In an aspect, there is provided an immersion lithographic apparatus comprising a liquid confinement structure configured at least partly to confine immersion liquid to an immersion space defined by a projection system, the liquid confinement structure and a substrate and/or substrate table; and a liquid supply device configured to supply an emulsified cleaning fluid to the liquid confinement structure, the liquid supply device comprising a high frequency exciter upstream of the liquid confinement structure.

In an aspect, there is provided an immersion lithographic apparatus comprising: a liquid confinement structure configured at least partly to confine immersion liquid to an immersion space defined between a projection system, the liquid confinement structure and a substrate and/or substrate table; a liquid supply device configured to supply a cleaning agent to the liquid confinement structure; and a controller configured to control the liquid supply device and to adjust operating conditions of the liquid confinement structure during cleaning such that the space is increased in size in a radial direction with respect to an optical axis of the projection system during cleaning compared to imaging operation.

In an aspect, there is provided an immersion lithographic apparatus comprising a liquid supply device configured to supply an emulsified cleaning fluid to a component to be cleaned, wherein the liquid supply device is configured such that first and second liquids are pushed through a mixer configured to mix the first and second liquids to form the emulsified cleaning fluid and to the component to be cleaned.

In an aspect, there is provided an immersion lithographic apparatus comprising: a liquid supply device comprising a mechanical mixer to mix immersion liquid with a cleaning fluid to form an emulsion for provision to a liquid confinement structure, wherein the immersion liquid and/or cleaning fluid and/or emulsion is flushed past an area where two surfaces of the mixer which move relative to each other are in contact and diverted from a path to the liquid confinement structure.

In an aspect, there is provided an immersion lithographic apparatus comprising: a liquid supply device comprising a mechanical mixer to mix immersion liquid and a cleaning fluid to form an emulsified cleaning fluid, a cooler upstream of the mixer to cool immersion liquid and/or cleaning fluid and/or emulsified cleaning fluid, and a heater downstream of the mixer to heat emulsified cleaning fluid to a certain temperature.

In an aspect, there is provided an immersion lithographic apparatus comprising: a liquid confinement structure configured at least partly to confine immersion liquid to an immersion space defined between a projection system, the liquid confinement structure and a substrate and/or substrate table, wherein a surface of the liquid confinement structure which, during cleaning, will come in contact with cleaning liquid has a surface energy of above 50 mJ/m$^2$.

In an aspect, there is provided a method of cleaning an immersion lithographic apparatus comprising passing an emulsion of immersion liquid and a cleaning fluid over a surface to be cleaned, rinsing the surface to be cleaned with a rinsing fluid different to the cleaning fluid and different to the immersion liquid, and reintroducing the immersion liquid onto the clean surface.

In an aspect, there is provided an immersion lithographic apparatus comprising: a liquid supply device comprising a mixer configured to mix a first liquid with an active cleaning agent liquid to form an emulsified cleaning fluid in which the active cleaning agent liquid is introduced into the first liquid through membrane.

In an aspect, there is provided an immersion lithographic apparatus comprising: a liquid supply device comprising a heater to heat a mixed first liquid with an active cleaning agent to dissolve the active cleaning agent in the first liquid, and a cooler to cool the first liquid with dissolved active cleaning agent to form an emulsified cleaning fluid.

In an aspect, there is provided an immersion lithographic apparatus comprising: a projection system; a liquid confinement structure configured at least partly to confine immersion liquid to an immersion space defined by the projection system, the liquid confinement structure and a substrate and/or substrate table; a liquid supply device comprising a conduit configured to provide emulsified cleaning fluid from an emulsified cleaning fluid source to the immersion space, the emulsified cleaning fluid comprising at least a first liquid component and a second liquid component; a sensor system configured to sense a property of the emulsified cleaning fluid; and a controller configured to control the supply of emulsified cleaning fluid to the immersion space.

In an aspect, there is provided a liquid supply device comprising: a mixer configured to mix liquid from a first liquid source with an active cleaning agent liquid from a second liquid source to form an emulsified cleaning fluid, and a conduit configured to provide emulsified cleaning fluid from the mixer, the emulsified cleaning fluid comprising at least a first liquid component and a second liquid component; a sensor system configured to sense a property of the emulsified cleaning fluid; and a controller configured to control the supply of liquid from the first liquid source and/or the second liquid source to the mixer in order to control a property of the emulsified cleaning fluid.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 2 and 3 depict a fluid handling structure as a liquid supply system for use in a lithographic projection apparatus;

FIG. 4 depicts a further liquid supply system for use in a lithographic projection apparatus;

FIG. 7 depicts schematically a liquid supply device;

FIG. 8 depicts schematically a further embodiment of a cleaning liquid supply system;

FIG. 12 schematically depicts a mixer;
FIG. 13 schematically depicts a mixer;
FIG. 14 schematically depicts a mixer;
FIG. 15 schematically depicts a mixer.

FIG. 20 schematically depicts an embodiment of a sensor configured to sense emulsion stability of an emulsion fluid flow and/or droplet size distribution; and FIG. 21 schematically depicts an embodiment of a sensor configured to sense emulsion stability of an emulsion fluid flow.

DETAILED DESCRIPTION

Figure 1:
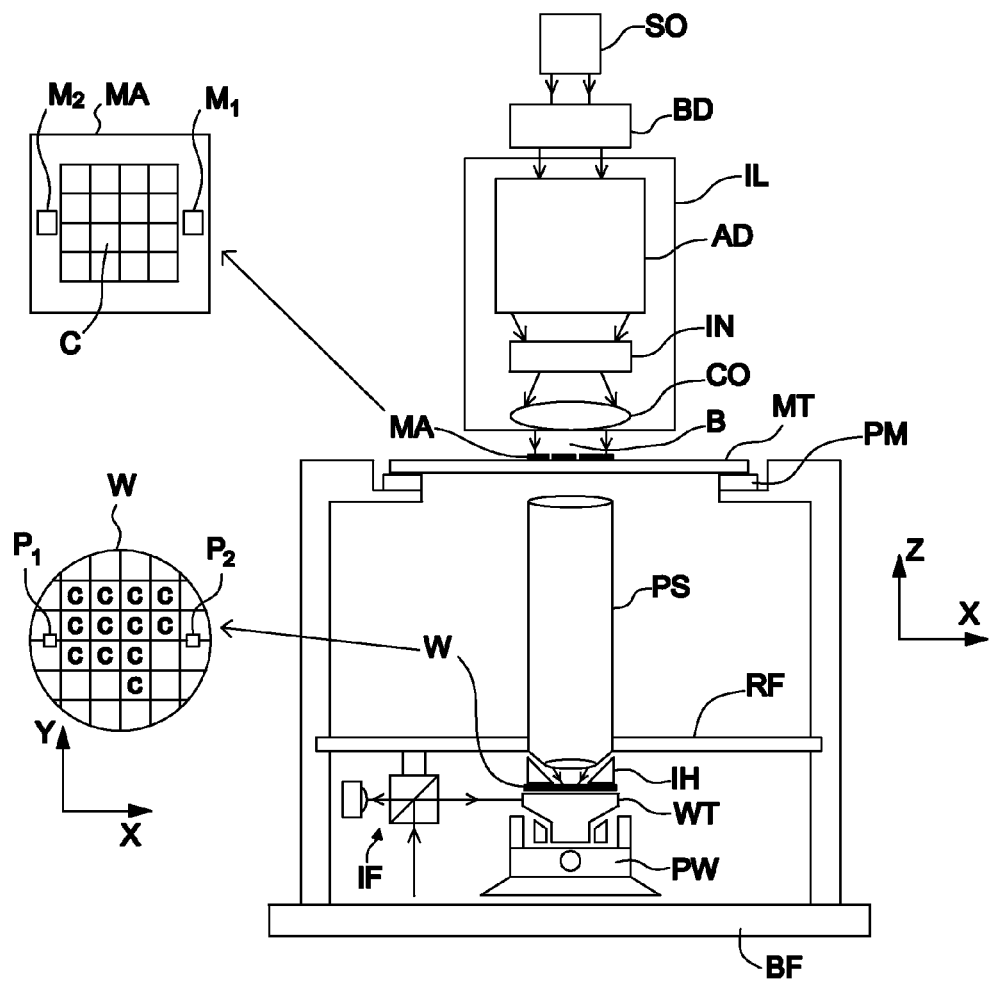
FIG. 1 depicts a lithographic apparatus according to an embodiment of the invention.

FIG. 1 schematically depicts a lithographic apparatus according to one embodiment of the invention. The apparatus comprises:

- an illumination system (illuminator) IL configured to condition a radiation beam B (e.g. UV radiation or DUV radiation);
- a support structure (e.g. a mask table) MT constructed to support a patterning device (e.g. a mask) MA and connected to a first positioner PM configured to accurately position the patterning device MA in accordance with certain parameters;
- a substrate table (e.g. a wafer table) WT constructed to hold a substrate (e.g. a resist-coated wafer) W and connected to a second positioner PW configured to accurately position the substrate W in accordance with certain parameters; and
- a projection system (e.g. a refractive projection lens system) PS configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device MA. The support structure MT holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as desired. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system. The types of projection system may include: refractive, reflective, catadioptric, magnetic, electromagnetic and electrostatic optical systems, or any combination thereof. The selection or combination of the projection system is as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source SO and the lithographic apparatus may be separate entities, for example when the source SO is an excimer laser. In such cases, the source SO is not considered to form part of the lithographic apparatus and the radiation beam is passed from the source SO to the illuminator IL with the aid of a beam delivery system BD comprising, for example, suitable directing mirrors and/or a beam expander. In other cases the source SO may be an integral part of the lithographic apparatus, for example when the source SO is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator IL can be adjusted. In addition, the illuminator IL may comprise various other components, such as an integrator IN and a condenser CO. The illuminator IL may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device MA. Having traversed the patterning device MA, the radiation beam B passes through the projection system PS. The projection system PS focuses the beam B onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

In step mode, the support structure MT and the substrate table WT are kept essentially stationary, while an entire pattern imparted to the radiation beam B is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

In scan mode, the support structure MT and the substrate table WT are scanned synchronously while a pattern imparted to the radiation beam B is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion C in a single dynamic exposure, whereas the length of the scanning motion determines the height (in the scanning direction) of the target portion C.

In another mode, the support structure MT is kept essentially stationary holding a programmable patterning device, and the substrate table WT is moved or scanned while a pattern imparted to the radiation beam B is projected onto a target portion C. In this mode, generally a pulsed radiation source is employed and the programmable patterning device is updated as desired after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In an arrangement a liquid supply system may provide liquid on only a localized area of an underlying surface, which may be a substrate and/or substrate table. The liquid may be confined between the final optical element of the projection system and the underlying surface, such as a substrate (the substrate generally has a larger surface area than the final optical element of the projection system), using a liquid confinement system.

An arrangement to provide liquid between a final element of the projection system PS and the substrate is the so called localized immersion system IH. In this system a liquid handling system is used in which liquid is only provided to a localized area of the substrate. The space filled by liquid is smaller in plan than the top surface of the substrate and the area filled with liquid remains substantially stationary relative to the projection system PS while the substrate W moves underneath that area. Four different types of localized liquid supply systems are illustrated in FIGS. 2-5.

One way which has been proposed to arrange for this is disclosed in PCT patent application publication no. WO 99/49504. As illustrated in FIGS. 2 and 3, liquid is supplied by at least one inlet onto the substrate, preferably along the direction of movement of the substrate relative to the final element. Liquid is removed by at least one outlet after having passed under the projection system. That is, as the substrate is scanned beneath the element in a −X direction, liquid is supplied at the +X side of the element and taken up at the −X side. FIG. 2 shows the arrangement schematically in which liquid is supplied via inlet and is taken up on the other side of the element by outlet which is connected to a low pressure source. In the illustration of FIG. 2 the liquid is supplied along the direction of movement of the substrate relative to the final element, though this does not need to be the case. Various orientations and numbers of in- and out-lets positioned around the final element are possible; one example is illustrated in FIG. 3 in which four sets of an inlet with an outlet on either side are provided in a regular pattern around the final element. Note that the direction of flow of the liquid is shown by arrows in FIGS. 2 and 3.

A further immersion lithography solution with a localized liquid supply system is shown in FIG. 4. Liquid is supplied by two groove inlets on either side of the projection system PS and is removed by a plurality of discrete outlets arranged radially outwardly of the inlets. The inlets and outlets can be arranged in a plate with a hole in its centre and through which the projection beam is projected. Liquid is supplied by one groove inlet on one side of the projection system PS and removed by a plurality of discrete outlets on the other side of the projection system PS, causing a flow of a thin film of liquid between the projection system PS and the substrate W. The choice of which combination of inlet and outlets to use can depend on the direction of movement of the substrate W (the other combination of inlet and outlets being inactive). Note that the direction of flow of the liquid is shown by arrows in FIG. 4.

Figure 5:
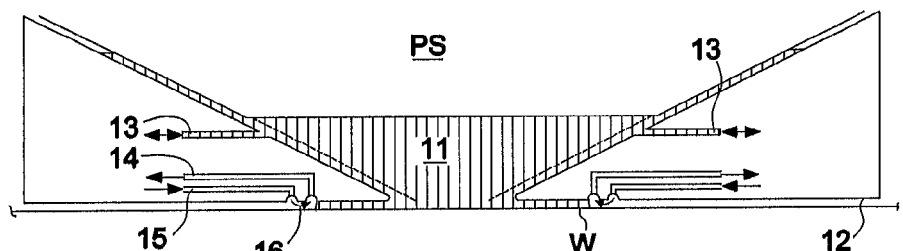
FIG. 5 depicts, in cross-section, a liquid confinement structure which may be used in an embodiment of the present invention as a liquid supply system.

Another arrangement which has been proposed is to provide the liquid supply system with a liquid confinement member which extends along at least a part of a boundary of the space between the final element of the projection system and the substrate table. Such an arrangement is illustrated in FIG. 5. The immersion system has a localized liquid supply system with a liquid confinement structure, which supplies liquid to a limited area of, for example, a substrate. The liquid confinement structure extends along at least part of a boundary of the space between the final element of the projection system and the underlying surface of the substrate, substrate table or both. (Please note that reference in the following text to the surface of the substrate also refers in addition or in the alternative to a surface of the substrate table, unless expressed otherwise). The liquid confinement member is substantially stationary relative to the projection system in the XY plane though there may be some relative movement in the Z direction (in the direction of the optical axis). In an embodiment a seal is formed between the liquid confinement structure 12 and the surface of the substrate W. The seal may be a contactless seal such as a fluid seal such as a gas seal or a capillary force seal. Such a system is disclosed in United States patent application publication no. US 2004-0207824, hereby incorporated in its entirety by reference.

The liquid confinement structure 12 at least partly contains liquid in the immersion space 11 between a final element of the projection system PS and the substrate W. A contactless seal 16 to the substrate W may be formed around the image field of the projection system so that liquid is confined within the space between the substrate W surface and the final element of the projection system PS. The immersion space is at least partly formed by the liquid confinement structure 12 positioned below and surrounding the final element of the projection system PS. Liquid is brought into the space below the projection system and within the liquid confinement structure 12 by liquid inlet 13. The liquid may be removed by liquid outlet 13. The liquid confinement structure 12 may extend a little above the final element of the projection system. The liquid level rises above the final element so that a buffer of liquid is provided. In an embodiment, the liquid confinement structure 12 has an inner periphery that at the upper end closely conforms to the shape of the projection system or the final element thereof and may, e.g., be round. At the bottom, the inner periphery closely conforms to the shape of the image field, e.g., rectangular, though this need not be the case.

In an embodiment, the liquid is contained in the immersion space 11 by a gas seal 16 which, during use, is formed between the bottom of the barrier member 12 and the surface of the substrate W. Other types of seal, such as a seal dependent on capillary forces and meniscus pinning, are possible, as is no seal (for example in an all wet embodiment). The gas seal is formed by gas, e.g. air or synthetic air but, in an embodiment, N2 or another inert gas. The gas in the gas seal is provided under pressure via inlet 15 to the gap between liquid confinement structure 12 and substrate W. The gas is extracted via outlet 14. The overpressure on the gas inlet 15, vacuum level on the outlet 14 and geometry of the gap are arranged so that there is a high-velocity gas flow 16 inwardly that confines the liquid. The force of the gas on the liquid between the liquid confinement structure 12 and the substrate W contains the liquid in an immersion space 11. The inlets/outlets may be annular grooves which surround the space 11. The annular grooves may be continuous or discontinuous. The flow of gas 16 is effective to contain the liquid in the space 11. Such a system is disclosed in United States patent application publication no. US 2004-0207824.

Other arrangements are possible and, as will be clear from the description below, an embodiment of the present invention may use any type of localized liquid supply system as the liquid supply system.

Figure 6:
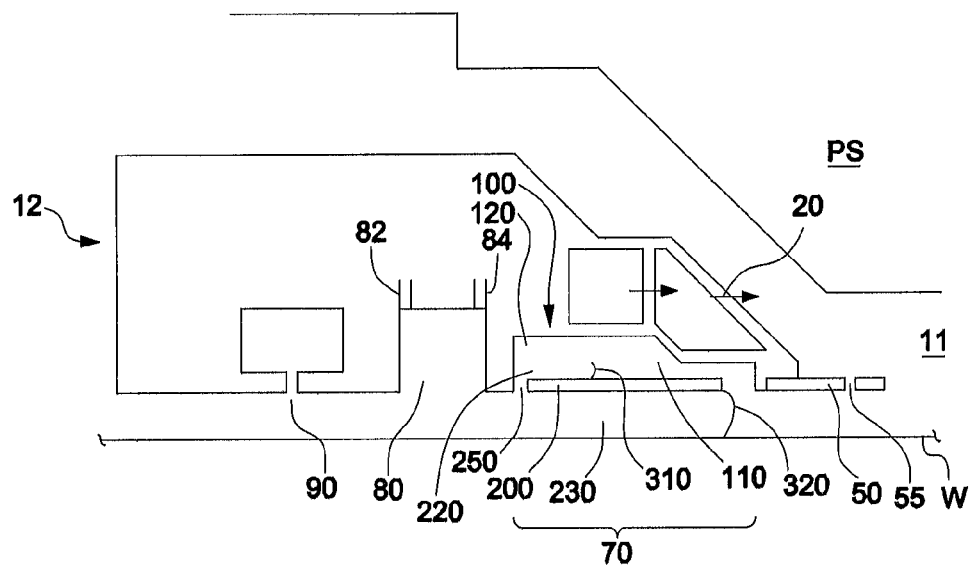
FIG. 6 depicts, in cross-section, a liquid confinement structure and projection system according to an embodiment of the invention.

FIG. 6 illustrates a liquid confinement structure 12 which is part of a liquid supply system. The liquid confinement structure 12 extends around the periphery (e.g., circumference) of the final element of the projection system PS.

The function of the liquid confinement structure 12 is at least partly to maintain or confine liquid in the space 11 between the projection system PS and the substrate W so that the projection beam may pass through the liquid.

A plurality of openings 20 in the surface which defines the space 11 provide the liquid to the space 11. The liquid passes through openings 29, 20 in side walls 28, 22 respectively prior to entering the space 11.

A seal is provided between the bottom of the liquid confinement structure 12 and the substrate W. In FIG. 6 a seal device is configured to provide a contactless seal and is made up of several components. Radially outwardly from the optical axis of the projection system PS, there is provided a (optional) flow control plate 50 which extends into the space 11. Radially outwardly of the flow control plate 50 on the bottom surface of the liquid confinement structure 12 facing the substrate W or substrate table WT may be an opening 180. The opening 180 can provide liquid in a direction towards the substrate W. During imaging this may be useful in preventing bubble formation in the immersion liquid by filling a gap between the substrate W and substrate table WT with liquid.

Radially outwardly of the opening 180 may be an extractor assembly 70 to extract liquid from between the liquid confinement structure 12 and the substrate W and/or the substrate table WT. The extractor assembly 70 may operate as a single phase or as a dual phase extractor.

Radially outwardly of the extractor assembly 70 may be a recess 80. The recess 80 is connected through an inlet 82 to the atmosphere. The recess 80 is connected via an outlet 84 to a low pressure source. Radially outwardly of the recess 80 may be a gas knife 90. An arrangement of the extractor assembly, recess and gas knife is disclosed in detail in United States patent application publication no. US 2006/0158627 incorporated herein in its entirety by reference. Note that in an embodiment the gas knife is absent.

The extractor assembly 70 comprises a liquid removal device or extractor or inlet such as the one disclosed in United States patent application publication no. US 2006-0038968, incorporated herein in its entirety by reference. In an embodiment, the liquid removal device 70 comprises an inlet which is covered in a porous material 110 which is used to separate liquid from gas to enable single-liquid phase liquid extraction. An under pressure in chamber 120 is chosen is such that the meniscuses formed in the holes of the porous material 110 prevent ambient gas from being drawn into the chamber 120 of the liquid removal device 70. However, when the surface of the porous material 110 comes into contact with liquid there is no meniscus to restrict flow and the liquid can flow freely into the chamber 120 of the liquid removal device 70.

The porous material 110 has a large number of small holes each with a dimension, e.g. a width, such as a diameter, $d_{hole}$ in the range of 5 to 50 µm. The porous material 110 may be maintained at a height in the range of 50 to 300 µm above a surface from which liquid is to be removed, e.g. the surface of a substrate W. In an embodiment, porous material 110 is at least slightly liquidphilic, i.e. having a dynamic contact angle of less than 90°, desirably less than 85° or desirably less than 80°, to the immersion liquid, e.g. water.

The level of the immersion liquid between the projection system PS and the liquid confinement structure 12 may fluctuate. Immersion liquid may remain on the surface of the projection system PS which may apply a thermal load affecting the focusing of the projection system. Liquid may flow onto the liquid confinement structure 12, spilling out of space 11. Although not specifically illustrated in FIG. 6, a liquidphobic (e.g., hydrophobic) surface may be present on the projection system PS, the liquid confinement structure 12, or both. The surface may be in the form of a coating. The liquidphobic surface may form a band around the top of the liquid confinement structure 12 surrounding the opening and/or around the last optical element of the projection system PS. The liquidphobic surface may be radially outward of the optical axis of the projection system PS. The liquidphobic (e.g., hydrophobic) surface helps to keep the immersion liquid in the space 11.

The examples of FIGS. 5 and 6 are a so called localized area arrangement in which liquid is only provided to a localized area of the top surface of the substrate W at any one time. Other arrangements are possible, including fluid handling systems which make use of a gas drag principle. The so-called gas drag principle has been described, for example, in United States patent application publication no. US 2008-0212046 and U.S. patent application Ser. No. 12/436,626 filed on May 6, 2009. In that system the extraction holes are arranged in a shape which desirably has a corner. The corner may be aligned with the stepping and scanning directions. This reduces the force on the meniscus between two openings in the surface of the fluid handing structure for a given speed in the step or scan direction compared to if the two outlets were aligned perpendicular to the direction of scan. An embodiment of the invention may be applied to a fluid handling structure used in all wet immersion apparatus. In the all wet embodiment, fluid is allowed to cover substantially the whole of the top surface of the substrate table, for example, by allowing liquid to leak out of a confinement structure which confines liquid to between the final element of projection system and the substrate. An example of a fluid handling structure for an all wet embodiment can be found in United States patent application publication no. US 2010-0060868.

An embodiment of the present invention will be described with reference to a liquid confinement structure 12 with the above mentioned structure. However, it will be apparent that any other type of liquid confinement structure or liquid handling system which provides liquid to an immersion space between the final element of the projection system PS and a substrate W may be applied in an embodiment of the invention. A liquid confinement structure or fluid handling system of both a localized area immersion lithographic apparatus and an all wet arrangement may be applied in an embodiment of the invention.

In the lithographic apparatus, contamination of one or more of the surfaces, for example a surface of the immersion space, such as a surface of the liquid confinement structure and/or of the substrate table WT, can build up over time if not removed. Such contamination may include a particle such as a flake of top coat and/or of the resist. The particle generally comprises a substituted acrylic polymer, such as a fluorinated polymethylmethacrylate resin. A cleaning liquid may be supplied to a surface in order to remove the contamination present.

An embodiment of the invention is intended to help solve the problem of contamination in an immersion lithographic apparatus. Such contamination can not only result in defects in the substrate but can also lead to a loss in performance of the liquid confinement structure 12, for example when the porous material 110 of the liquid removal device 70 becomes blocked with contamination. This can lead to the seal between the liquid confinement structure 12 and the substrate W and/or substrate table WT breaking down and resulting in undesirable loss of liquid out of the space 11.

U.S. patent application publication no. US 2009-0195761 and U.S. patent application publication no. US 2010-0097587 relate to cleaning solutions which may be used in an immersion lithographic apparatus and to typical cleaning schedules.

In U.S. patent application publication no. US 2009-0195761, a cleaning schedule is disclosed in which the lithographic apparatus does not need to be dissembled in order for cleaning to occur. U.S. patent application publication no. US 2010-0097587 relates to a cleaning liquid and in particular to a cleaning liquid which does not deleteriously affect components of the lithographic apparatus.

That the, as described in U.S. patent application No. 61/178,432 filed on 14 May 2009, it is possible to use an additive (e.g. an active cleaning agent) in immersion liquid during imaging of a substrate to clean and/or prevent contamination built-up. The prevention in contamination can be achieved at the same time as maintaining high transmittance of the immersion liquid (in one embodiment ultra pure water) and without damaging components of the lithographic apparatus. In one embodiment the additive added to the immersion liquid is present at a dilute concentration for example 1 ppm or less.

In one embodiment the immersion lithographic apparatus itself mixes liquids from first and second liquid sources. The first liquid source may be a base liquid source, such as a normal immersion liquid source (for example a source of ultra pure water), and the second liquid source is the source of an addition (e.g. a cleaner) which is mixed into the liquid from the first liquid source. Further liquid sources may be provided with further additives.

Substrates are generally coated with a bottom anti-reflective coating (BARC), a resist and a topcoat. The topcoat generally serves to protect the photo-reactive resist e.g. against adverse effects of prolonged contact with the immersion fluid. Additionally or alternatively, a topcoat can be used to realize a desired contact angle of the coated substrate top surface when in contact with immersion liquid. Resists have been developed which may be used without a topcoat in an immersion exposure process. Such a resist is sometimes referred to as a 'topcoatless resist'. Such a topcoatless resist has a higher contact angle than resists which require the use of a topcoat. Such a resist has a different chemical composition from topcoat. Thus, the composition of the contaminating particles generated from topcoatless resist coated substrates differ from those of topcoat coated substrates. So a different cleaning liquid may be developed to clean the different type of contamination generated when exposing topcoatless resist coated substrates in an immersion system. Cleaning of all of the BARC, resist (topcoatless or otherwise) and/or topcoat is envisaged by an embodiment of the present invention.

One such cleaning liquid is an emulsion. The emulsion cleaning liquid comprises or consists of a base liquid, which may be the same as the immersion liquid and may be water, with an at least partially immiscible component (e.g. an active cleaning agent liquid). The at least partially immiscible component may be present as a solute in the base liquid and present in substantially liquid form as droplets suspended in the base liquid.

Although it would be beneficial in terms of cleaning to use a pure cleaning liquid or one which is only slightly diluted, this may have one or more drawbacks. First, there may be difficulty with the chemical compatibility of the cleaning liquid with the material of one or more components of the lithographic apparatus. Furthermore, there may be a safety issue related to highly concentrated cleaning liquid. At too low a concentration cleaning occurs too slowly to be desirable. Some parts of an immersion lithographic apparatus may be made of perfluoro alkoxy (PFA) or stainless steel and so would be resistant to cleaning fluid in its pure form. However, not all parts of an immersion lithographic apparatus may be made of material resistant to the cleaning liquid and arranging for this would require redesign and upgrades. For certain components there is no practical solution yet because other requirements such as mechanical stiffness and change in contact angle with the immersion liquid (for example, a porous member of a single phase extractor or a component of the substrate table surrounding the edge of the substrate) cannot be met with such material. Therefore, the use of an active cleaning agent in a liquid in emulsified form is desirable because sufficient cleaning efficiency can be achieved without material compatibility and/or safety problems. Furthermore, less cleaning fluid may be required than would be the case if pure cleaning fluid were used. However, if the active agent is in too high a concentration, large droplets could be formed in the emulsion and this may damage the lithographic apparatus. In an embodiment, the use of PFA, polytetrafluoroethylene (PTFE), ethylene tetrafluoroethylene (ETFE), fluorinated ethylene propylene (FEP) and stainless steel is desirable for all locations where cleaning fluid can be expected.

In using a cleaning liquid which is an emulsion it may be important to ensure that the proportions between the base liquid and the partially immiscible (or partly miscible) component is in a desired working range such that the cleaning liquid is an emulsion. When a sufficiently large amount of the component is present in the cleaning liquid, cleaning may occur. However, when the proportion of the cleaning liquid which is the separate partially immiscible component is sufficiently large, damage may be caused to a surface of the immersion system, for example a delicate surface such as a liquidphobic coating.

The emulsion cleaning liquid comprises at least two components: a liquid which is the base liquid with a quantity of the partially immiscible (or partly miscible) component in solution; and droplets of the at least partially immiscible component separate from the base liquid and suspended in the basic liquid as an emulsion. At given proportions of the base liquid and the component, the quantity of the component which forms the droplets is dependent on parameters which in a non-limiting list include the temperature, flow rate and/or pressure of the liquid as well as the effectiveness of the process of mixing the base liquid and the component.

The proportion of the base liquid and the separate component in the cleaning liquid may be determined by a dynamic equilibrium dependent on one or more of parameters. Therefore between mixing and supplying the cleaning liquid, the conditions of the emulsion may change after mixing. For example: the average size and/or number density of the droplets of component in base liquid may change; the proportion by volume of the separate component not dissolved in the base liquid in the cleaning liquid may change; the concentration of the component as a solute in the base liquid may change. The emulsion may be unstable; it may require a settling time to achieve stable relative proportions of the base liquid and component liquid. That is emulsion coarsening may take place. This means, for example, coalescence of droplets, flocculation, and/or sedimentation (and/or creaming, dependent on the density ratio).

If the proportion of the component liquid present in the cleaning liquid supplied to an immersion system is above a certain threshold, the surface of the immersion system may be damaged. For example, if the size of droplets of the second component becomes too large, a sensitive part of the apparatus may be damaged. To avoid this, where a high volume fraction of component is used, more shear during mixing or more surfactant may be necessary. The component in liquid form may have sufficient chemical strength to dissolve a material present on a surface of the immersion system. The cleaning effect of the component without a base liquid may be too great for the component to be used on its own. It is desirable to ensure that the proportion of the separate component liquid is above a minimum threshold, ensuring that it is not too low. If the cleaning effect of the cleaning liquid is too low, cleaning may take longer than desirable. Downtime may increase.

It is therefore desirable to have a cleaning liquid supply system which: controls the flow rate of the base liquid and the component as they are mixed; and/or monitors the state of the emulsion or emulsified cleaning fluid (e.g. dispersed phase fraction and/or droplet size distribution) to ensure the emulsion supplied effectively cleans without causing damage. In monitoring the emulsion cleaning liquid, a sensor or sensor system may be used to sense a physical property of the emulsion, such as an optical property of the emulsion. The sensor may be an optical sensor. The sensor may be connected to one or more control devices in the cleaning liquid supply system, such as (in a non-limiting list) a thermal control device, a liquid supply device, a mixing control device, and/or a pressure control device.

The pressure control device may control the pressure in the cleaning liquid supply system, for example of the base liquid and/or the component liquid as they are supplied to a mixer, the pressure of the emulsion cleaning liquid as it is supplied to an immersion system, or both. The thermal control device may be used to control the temperature in the cleaning liquid supply system of the base liquid and/or the component liquid before mixing and the mixed cleaning liquid, even in a mixer. The liquid supply device may be used to control the flow rate of the base liquid and/or the component as they are supplied to the mixer. The mixing control device may control one or more parameters of mixing, for example the quantity, and therefore the proportion, of the base liquid and/or the component supplied to the mixer.

FIGS. 7 and 8 illustrate schematically embodiments of a cleaning liquid supply system 10 of an immersion lithographic apparatus according to an embodiment of the present invention. FIG. 7 illustrates an embodiment in which a conventional immersion liquid supply 212 and a cleaner fluid/mixture supply 224 are in parallel. FIG. 8 illustrates an embodiment in which the conventional immersion liquid supply 212 and the cleaner fluid/mixture supply 224 are in series. The cleaner fluid/mixture supply 224 can be retrofitted to an existing immersion lithographic apparatus which comprises a conventional immersion liquid supply 212.

FIG. 7 illustrates components of an immersion lithographic apparatus under the control of a controller 200. The controller 200 controls the apparatus such that the cleaning liquid supply system 10 mixes immersion liquid with at least one additive. The cleaning liquid supply system 10 comprises a first liquid source 210. The first liquid source 210 typically provides immersion liquid, for example ultra pure water. The first liquid source itself may connected to source of the immersion liquid, for example a supply of ultra pure water, for example in a semiconductor fabrication plant (a 'fab').

A second liquid source 220 is also provided which is a source of an additive, such as the component, e.g. a liquid component. The second liquid source itself may be connected to a source of the additive, for example a container of additive in the fab. The additive from the second liquid source 220 may be of only one type of additive, may be a dilute solution of an additive, may be a mixture of two or more types of additive or may be a solution of two or more types of additive. Third and fourth further liquid sources 221, 222 may also be provided. The further liquid sources 221, 222 may comprise other additives which can be mixed selectively under control of controller 200 into the immersion liquid. The additives in the further liquid sources 221, 222 may be any of the liquids described above. The liquid from the further liquid sources may be used as a component to form an emulsion in a base liquid.

In an embodiment, at least one of the second or further sources may include an additive, such as a surfactant, a detergent, soap, an acid, an alkaline, a solvent (such as a non-polar organic solvent or a polar organic solvent), a stabilizer, any other suitable cleaner for the lithographic apparatus, or any combination of the above. A desirable additive is a surfactant, such as soap. Another desirable additive is a solvent. A combination of a surfactant and a solvent is particularly desirable. The cleaner may include diethylene glycol monobutyl ether and/or ethoxylated secondary C12-14-alcohol, e.g. alkyloxypolyethyleneoxyethanol. In an embodiment, the cleaner may be a mixture of water, diethylene glycol monobutyl ether, and ethoxylated secondary C12-14-alcohol, such as TLDR-A001 or TLDR-A001-C4, which are manufactured by Tokyo Ohko Kogyo Co., Ltd.

In an embodiment, the cleaner may include water, one or more solvents selected from the group comprising: a glycol ether, an ester, an alcohol or a ketone, and a surfactant. In an embodiment, the water is clean, for example the water may be ultra-pure water. The solvent should be chosen to have a reasonable match with the contamination that is to be removed. This can be determined, for example, using the Hansen theory (see, for example, Hansen Solubility Parameters, Charles M. Hansen, $2^{nd}$ edition, CRC press, ISBN 0-8493-7248). Typically, the solvent will have a match, determined using the Hansen theory, of at least 50% (i.e. it will be positioned near the center of the Hansen solubility sphere).

The solvent used will also in general be completely mixable in water. In an embodiment, the solvent may have a solubility of more than 10 wt % in water. In an embodiment, the solvent may have a flash point above 38° C., for example above 70° C. or above 93° C.

A glycol ether for use in the cleaning fluid may include a propylene glycolether, such as propylene glycol methyl ether (PGME), dipropylene glycol methyl ether (DPGME), tripropylene glycol methyl ether (TPGME), propylene glycol ethyl ether (PGEE), propylene glycol normal propyl ether (PGPE), dipropylene glycol normal propyl ether (DPGPE), propylene glycol normal butyl ether (PGBE), dipropylene glycol normal butyl ether (DPGBE), tripropylene glycol normal butyl ether (TPGBE) or propylene glycol tertiary butyl ether (PGTBE); or an ethylene glycolether, such as diethylene glycol methyl ether (DEGME), diethylene glycol ethyl ether (DEGEE), diethylene glycolpropyl ether (DEGPE), ethylene glycol butyl ether (EGBE) or diethylene glycol butyl ether (DEGBE); a propylene glycol ether acetate, such as propylene glycol methyl ether acetate (PGMEA) or dipropylene glycol methyl ether acetate (DPGMEA); or an ethylene glycol ether acetate, such as ethylene glycol butyl ether acetate (EGBEA) or diethylene glycol butyl ether acetate (DEGEA). In an embodiment, the glycol ether may be selected from DEGBE, DEGPE, PGME and DPGME. In an embodiment, the glycol ether is DEGBE.

An ester for use in the cleaning fluid may include a compound which has an ester functionality. Suitable compounds include methyl lactate, ethyl lactate, propyl lactate, butyl lactate, gamma butyrolactone, methyl acetate, ethyl acetate, propyl acetate, butyl acetate, isobutyl acetate, t-butyl acetate or gamma butyrol acetate. In an embodiment, the ester is a dibasic ester. In an embodiment, the ester is ethyl lactate or butyrolactate. In an embodiment the ester is a cyclic ester.

A ketone for use in the cleaning fluid may include cyclohexanone or diacetone alcohol.

An alcohol for use in the cleaning fluid may include methanol, ethanol, propanol (such as isopropanol), t-butyl alcohol, 4-methyl-2-pentanol or cyclohexanol.

In an embodiment, the solvent is selected from one or more glycol ethers or esters. In one embodiment, the solvent is selected from one or more glycol ethers.

In an embodiment, the solvent is selected from DEGBE or ethyl lactate. In an embodiment, the solvent is DEGBE.

In an embodiment, the surfactant is selected from one or more nonionic, cationic or anionic surfactants. In an embodiment, the surfactant is selected from one or more nonionic surfactants. In an embodiment, the surfactant comprises a nonionic surfactant which is an ethylene oxide/propylene oxide block copolymer with a molecular weight from 1000 to 3000. A suitable such surfactant is Pluronic® L61 difunctional block copolymer surfactant terminating in primary hydroxyl groups from BASF. In an embodiment, the surfactant comprises a defoaming wetting agent such as Envirogem® AD01 from Air Products.

In an embodiment, the additive may further comprise a pH adjustment chemical. If present, the pH adjustment can be used to help ensure that the pH of the cleaning fluid is from 7 to 10, for example from 8 to 10 or from 9 to 10. A suitable pH adjustment chemical may include an inorganic base such as sodium hydroxide, potassium hydroxide or a phosphate buffer. Increasing the pH of the solution can decrease the adhesive forces between the contaminant and the surface and may therefore result in more efficient cleaning However, increasing the pH beyond 10 should in general be avoided since this may lead to damage to parts of the lithographic apparatus, for example an optical element of the projection system.

In an embodiment, the additive(s) may be free from nitrogen containing compounds. In an embodiment, the cleaning fluid may be free from ammonia and amines. These compounds are volatile alkalines and may adversely affect the processing of the photo resist.

Solvents are generally considered to remove contamination mainly by chemical dissolution.

In one embodiment, the additive is TLDR-A001 or TLDR-A001-C4.

In one embodiment, the additive is a mixture of a soap and a solvent. In one embodiment, the additive includes a surfactant.

In one embodiment, the additive comprises a glycol ether, an ester, an alcohol and/or a ketone.

In one embodiment, the additive comprises a topcoat cleaner.

If the additive is a surfactant, this reduces the chance of particles sticking to a wetted surface (like the porous member 110). Therefore, the particles can be flushed away into the extraction system.

It is noted that one or more of the above mentioned cleaning liquids may form an emulsion when present in a sufficient concentration in another liquid, i.e. a base liquid such as an immersion liquid, for example water. In such a base liquid the cleaning liquid may be considered a cleaning component.

Selection of a suitable cleaning liquid as a component to form an emulsion requires knowledge of the solubility in the liquid used as the base liquid. Such information may be obtained, where the base liquid is a well known solvent such as water, from consulting a well known chemical text, such as the CRC Handbook of Chemistry and Physics (ISBN: 0-8493-0479-2). This text supplies information relating to the relative scales for solubility: 1 is insoluble; 2 is slightly soluble; 3 is soluble; 4 is very soluble; 5 is miscible; and 6 decomposes. A suitable cleaning liquid for use as a component in emulsion would be in category 2 or 3; although category 2 is preferred. A cleaning liquid in categories 1, 4 or 5 may be undesirable. Such information may be available from the Material Safety Data Sheet (MSDS) of each specific commercially available cleaning liquid.

Liquid from the first liquid source 210 is provided to the immersion liquid supply 212 which regulates the supply. From the immersion liquid supply 212, immersion liquid is supplied via a conduit to the cleaner supply 224. Here a regulator 225 regulates the flow of immersion liquid from the first liquid source 210 to a conditioning unit 242. In an embodiment, the conditioning unit 242 comprises one or more filters, heat exchangers, etc. to condition the immersion liquid. In an embodiment, a filter is present to filter fluid supplied from one or more fluid sources. The filter may be a filter to filter liquid. In an embodiment each fluid source, e.g. liquid source, supplies fluid (e.g. liquid) through a filter before the fluids are mixed. In this case a particle which may be present in the supplied fluids is removed before the fluids are mixed to form the cleaning liquid. The cleaning liquid may be at least substantially particle free.

Regulator 225 provides immersion liquid to an injection point 223. At point 223 fluid, such as component liquid, from the second liquid source 220 and/or further liquid sources 221, 222 is added to immersion liquid from the first liquid source 210. There may be an immersion liquid filter located in the liquid flow path of one or more of the liquid sources 210, 220, 221, 222 before the injection point 223.

Figure 9:
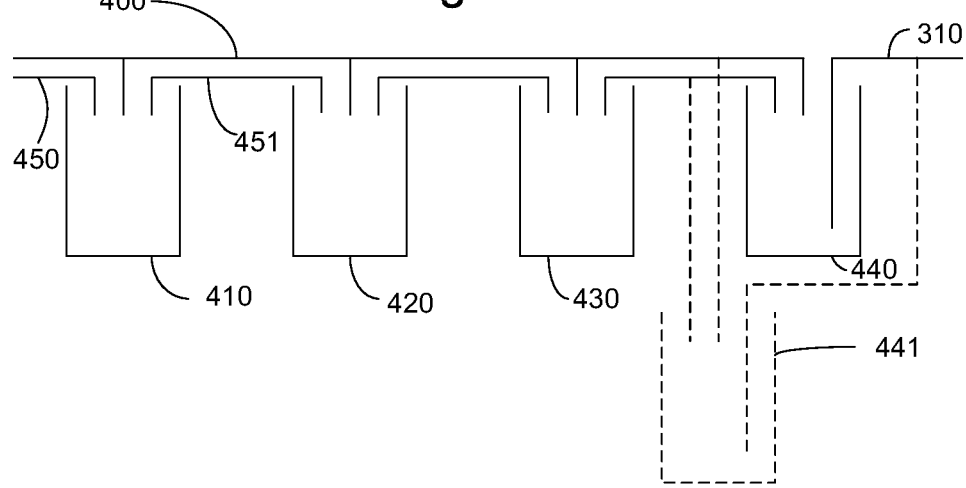
FIG. 9 depicts schematically a mixer.

In an embodiment, a flow regulator 226 is employed to regulate the flow of immersion liquid to the injection point 223. Additive from at least one of the liquid sources 220, 221, 222, such as the liquid component, is diluted in immersion liquid to form a mixture. The mixture then passes along conduit 228 to a mixer 300. FIG. 9 illustrates one embodiment of a mixer. In an embodiment the mixer can be used to achieve a very low concentration of additive in immersion liquid. In an embodiment the mixer is a passive mixer.

Immersion liquid from the conditioning unit 242 is passed to the mixer 300. The two liquids are mixed at mixer 300 under the control of controller 200. An embodiment of the injection point 223 and/or mixer 300 will be described below with reference to FIG. 9.

A conduit 310 leads from the mixer 300 to the liquid confinement structure 12. In this way immersion liquid which has had an additive from the second liquid source 220 and/or further liquid source 221, 222 added, such as the component liquid, is provided to the liquid confinement structure 12.

In one embodiment liquid with additive is only provided to an opening 180 defined in an undersurface of the liquid confinement structure 12 which faces the substrate W on substrate table WT. In another embodiment, immersion liquid which has had additive added may also be provided to an opening 20 into the immersion space 11 through which the projection beam PB projects. For this purpose a valve 248 may be provided to regulate flow.

In an embodiment illustrated in dotted lines, a further conduit 213 may be provided. The further conduit 213 supplies immersion liquid which has not been mixed with liquid from the second liquid source 220 or a further liquid source 221, 222 to the liquid confinement structure 12. A regulator 246 may be used to control such supply. This supply of immersion liquid in parallel to the liquid with additive may be for exiting out of the (immersion liquid supply) opening 20. This may be advantageous because then liquid through which the projection beam PB passes will not have any additive in it. Thus, the transmittance of the projection beam PB will not be reduced at all by the additive. Additionally or alternatively, the risk of deposit on a surface of the immersion system, such as the final optical element, may be mitigated. The deposit may be derived from the cleaning liquid, a product of the cleaning action of the cleaning liquid, or both, which may be carbonaceous. In this embodiment the liquid which does have the additive will be the liquid which is likely to come into contact with the porous member 110, which is a member of the immersion system which may be particularly susceptible to contamination. In one embodiment the liquid confinement structure 12 is configured to help ensure that the two types of liquid exiting openings 20 and 180 remain substantially separated.

FIG. 8 illustrates an embodiment which is the same as the embodiment of FIG. 7 except as described below. In the embodiment of FIG. 8 the immersion liquid supply 212 and cleaner supply 224 are in series. The additive from the second and/or further liquid sources 220, 221, 222, for example the component liquid, is mixed with the base liquid, such as immersion liquid, by mixer 300 in the cleaner supply 224. A single conduit 310 exits the cleaner supply 224 into the liquid conditioner 242.

As with all other embodiments, the emulsion may be supplied pre-mixed (e.g. in a storage container). In that case, the emulsion could be prepared off site or off line, for example using the components of the cleaning liquid supply system 10 to the mixer 300 and collecting the emulsion downstream of the mixer 300 into a storage container. The emulsion can then be provided to a system comprising the components either immediately upstream or downstream of the mixer 300 to be provided to the liquid confinement structure 12.

An optional conduit 245 may be provided which is similar to the conduit 213 of the FIG. 7 embodiment. The conduit 245 may optionally have a liquid conditioner similar to conditioner 242. A regulator 246 may be used to control supply through conduit 213 to the liquid confinement structure.

FIG. 9 illustrates one embodiment of an injection point 223 or of a mixer 300. In an embodiment, the proportion by volume of the additive, e.g. the component, added to the base liquid, e.g. immersion liquid, to form the emulsion cleaning liquid is in the range of ratios of 1:5 to 1:30, where the greater volume is the base liquid. In an embodiment the range of ratios is 1:10 to 1:20, for example 1:10 to 1:15 depending, for example on the miscibility of the additive (e.g., organic solvent) in the base liquid. It can be difficult to simply continually meter a low flow rate of additive into a line of flowing immersion liquid. It may not be practical to supply a single fluid source of cleaning liquid pre-mixed with additive because of the large amount of liquid used by the apparatus. The cleaning liquid may be unstable if left for a long time, for example during storage.

In FIG. 9 a line 400 in fluid communication with the first liquid source 210, i.e. the base liquid for example immersion liquid such as ultra-pure water, is provided. Liquid from the first liquid source 210 may be metered into first, second, third and fourth reservoirs 410, 420, 430, 440. Liquid from the second liquid source 220 (and/or a further liquid source 221, 222), such as the liquid component, can be metered through conduit 450 into the first reservoir. By metering a large amount of liquid from the first liquid source 210 into the reservoir 410 compared to the amount of liquid from the second or further liquid source 220, 221, 222 through conduit 450 into reservoir 410 a low concentration of liquid from the second or further liquid source 220, 221, 222 in liquid from the first liquid source 210 can be achieved in reservoir 410.

Once the first reservoir 410 is sufficiently filled, liquid from the first reservoir 410 may be metered via conduit 451 into the second reservoir 420. Liquid from the first liquid source may also be metered into second reservoir 420 via conduit 400. By ensuring that the amount of liquid from the first liquid source 210 is far greater than the amount of liquid from the first reservoir 410, the concentration of additive in the second reservoir 420 may be made much lower than the concentration of additive in the first reservoir 410.

A similar process may be repeated with the third 430 and fourth 440 reservoirs by metering from the second reservoir 420 into the third reservoir 430 and from the third reservoir 430 into the fourth reservoir 440. Liquid from the fourth reservoir 440 will then be of a very low but accurately determined concentration and can be provided via conduit 310 from the mixer 223, 300 to the liquid confinement structure 12.

This system works by first filling the first reservoir 410 which will contain liquid for a long time before needing replenishing. The second reservoir 420 will be replenishing more quickly than the first reservoir 410 as will the third and fourth reservoirs 430, 440 in turn. Any number of reservoirs can be used in this way. A desired number is at least two. The liquid from the second or further liquid source 220, 221, 222 may already be in dilute form.

In order to help ensure continuous operation, a further e.g. final reservoir may be provided (the fourth reservoir 441 in FIG. 9). The further reservoir 441 may be provided with base liquid from the first liquid supply 210 through conduit 400 and with liquid from the third reservoir 430 while liquid from the fourth reservoir 440 is being supplied to the liquid confinement structure 12. When the fourth reservoir 440 is empty, the supply of liquid to the liquid confinement structure 12 may continue uninterrupted from the further reservoir 441. During this period the fourth reservoir 440 may be filled up again ready to be used when the further reservoir is used up.

The mixer in FIG. 9 is just one sort of mixer. Other types of suitable mixer are shown in FIGS. 11 to 15. Each of the mixers shown in FIGS. 11 to 15 is a passive mixing device. Each mixer 300 has two ends: one 152 for the entry of liquid and the other 154 for exit of liquid. In the embodiments shown in FIGS. 11 to 15 the liquids have been introduced to each other. The purpose of the mixer is to ensure that the mixed liquids are sufficiently mixed that a stable emulsion is formed. The mixing may be required to ensure that the droplet size does not exceed a certain threshold. The mixers ensure that the mixed liquids are sufficiently agitated. In a passive arrangement this may be achieved by the mixing liquids following a tortuous path. An arrangement according to that shown in FIG. 9 may agitate the mixed liquids to provide the desired stable emulsion for the cleaning liquid.

Figure 10:
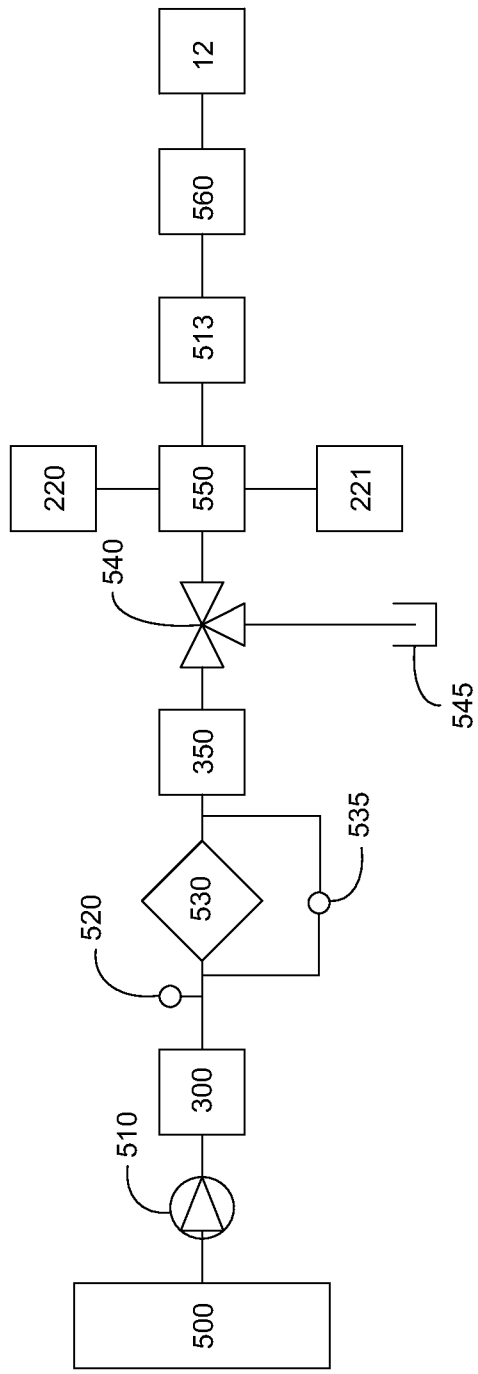
FIG. 10 depicts schematically a further embodiment of a cleaning liquid supply system.

FIG. 10 illustrates a further embodiment of a cleaning liquid supply system 10. The embodiment of FIG. 10 is designed specifically for supplying an emulsion. In the embodiment of FIG. 10 the base liquid and at least partly immiscible component are provided together in a vessel 500. The base liquid and at least partly immiscible component may be provided in the vessel 500 on delivery of vessel 500 to the site of the lithographic apparatus. Alternatively, the base liquid and at least partly immiscible component may be mixed together on site and placed into vessel 500. In an embodiment the base liquid and at least partly immiscible component may be provided each from separate vessels through a flow control valve and optionally through a filter, for example in a way similar to that illustrated in the embodiments of FIGS. 7 and 8.

The two phase mixture in vessel 500 is in fluid communication with a pump 510. The pump 510 is upstream of all components of the cleaning liquid supply system 10 other than the one or more liquid sources (e.g. the vessel 500 or separate vessels, one or more flow control valves and one or more filters). That is, mixer 300, temperature sensor 520, filter 530, pressure sensor 535, detector 350, valve 540, chemical drain 545, multi valve 550, bypass assembly 513 and high frequency exciter 560 are all downstream of the pump 510.

The pump 510 is used to overcome the pressure loss that is induced by the mixer 300 and filter 530 and other parts downstream of the pump 510 in the liquid supply device 10. Therefore, the pump 510 pushes the emulsion through the cleaning liquid supply system 10 rather than pulls the liquid through the cleaning liquid supply system 10.

In an embodiment, the vessel 500 may be pressurized with gas thereby pushing the emulsion through the cleaning liquid supply system 10. In that case the pump 510 may not be required.

The amount of flow of base liquid, at least partly immiscible component or of mixed emulsion is determined by a liquid flow controller or another type of flow control device under the control of controller 200. A flow rate of 1-5 liters/minute at 1-5 barg pressure is typical.

Downstream of the pump 510 is a mixer 300. Desirably the mixer 300 is optimized to create the one or more desired properties of the emulsion. The type of mixing device may be determined by the desired droplet size of the at least partially immiscible component in the emulsion. In particular, the mixer 300 may be optimized to control the droplet size in the emulsion. FIGS. 11 to 15 illustrate some embodiments of mixer 300. The mixer 300 is designed to shake up the emulsion. The emulsion has a tendency to settle in the storage vessel 500, so that demixing occurs. The mixer 300 is intended to create a homogenous distribution of droplet size and also to develop the droplet size to fall within a certain, e.g. a predetermined range. In one embodiment, the mixer 300 creates a large shear stress within the fluid to break up the incoming emulsion droplets. In an embodiment, the mixer 300 is a passive mixer.

A temperature sensor 520 is provided downstream of the mixer 300. The signal from the temperature sensor 520 is passed to the controller 200. If the temperature of the emulsion rises above a certain level as measured by the temperature sensor 520, e.g. above a predetermined level, the mixing action provided by the mixer 300 can be reduced. This will help prevent the temperature of the emulsion from being too high. The controller 200 reduces the mixing action of the mixer 300 (for example by reducing the flow rate through pump 510) thereby to reduce the temperature of the emulsion. If the temperature of the emulsion as measured by the temperature sensor 520 is too high, the arrival of the emulsion at the liquid confinement structure 12 can be prevented. For example, the flow of emulsion can be switched to a drain 545 by valve 540 described below. In one embodiment the controller 200 may control the mixer 300 and/or flow rate in a feedback manner based on the signal from the temperature sensor 520.

A particle filter 530 is provided downstream of the temperature sensor 520. The particle filter 530 filters any droplets of the at least partly immiscible component which are too large. That is, the filter 530 is designed to filter out any droplets of the at least partly immiscible component which are larger than a certain size, e.g. larger than a predetermined size. For example, the filter 530 can be used to filter droplets of the at least partly immiscible component which would otherwise get stuck in one or more immersion liquid particle filters downstream in the cleaning liquid supply system 10 or in a conduit or opening formed in the liquid confinement structure 12 through which the cleaning fluid will pass. An immersion liquid filter typically filters particles of a size down to 30 μm whereas the pore size of pores in the extractor 70 in the porous member 110 illustrated in FIG. 6 might, for example, be of the order of 10-20 μm. Therefore, the filter 530, in one embodiment, is adapted to filter out droplets of the at least partly immiscible component which are larger than 5 μm in diameter.

In all embodiments a desired droplet size range is 0.5-5 μm, for example less than 5 μm or in the range of 0.5-2.0 μm in diameter. In an embodiment, a droplet size of 2 μm is used. Additionally, if the droplet size is too large, phase separation may occur before the emulsion reaches the liquid confinement structure 12, or during cleaning of the liquid confinement structure 12. In one embodiment, a maximum droplet size is 10 μm.

The openings used in the so-called gas drag principle fluid handling system mentioned above may be of the order of 20 μm in diameter and may be in the range of 20 to 100 μm. Therefore droplet sizes of 20 μm and larger are of the same order of magnitude in size as those openings and therefore such a large droplet size is not desirable for that type of fluid handling system. Even if the opening is larger, for a droplet to pass through without occluding most of the opening and possibly blocking it, the droplet diameter could, for example, desirably be less than half the largest diameter of the opening.

In an embodiment an immersion lithographic apparatus comprises a liquid supply device comprising a source of an emulsified cleaning liquid and a filter. The filter is configured to filter fluid droplets of a second liquid of the emulsified cleaning fluid with a diameter above a certain diameter. In an embodiment, the immersion lithographic apparatus further comprises a pressure sensor to measure the pressure drop over the filter. In an embodiment, the immersion lithographic apparatus further comprises a controller configured to generate a signal when the pressure sensor measures a pressure drop above a certain level. A pressure sensor can be used in the same way over the sieve of FIG. 15 described below.

The filter 530 is different to the filter for immersion liquid when the immersion liquid is water. In one embodiment the filter 530 is not provided but filtering of the base liquid (such as water) and the at least partly immiscible component is done when those two liquids are separate phases (i.e. before they are brought together, upstream of the vessel 500) as in, for example the FIG. 11 embodiment. In such an embodiment it is desirable that the mixer 300 is a passive mixer because an active mixer is likely to generate more particles during mixing and those particles would then not have to pass through a filter 530 before being provided to the liquid confinement structure 12. In one embodiment a pressure of a few bar (e.g. 1-5) may be applied to the liquid to force the liquid through the filter 530.

Clogging (or at least partial blocking) of filter 530 should be monitored. To this end, a pressure sensor 535 is provided to measure the pressure drop over the filter 530. The signal from the pressure sensor 535 is fed to the controller 200. The controller can thereby determine when the filter 530 becomes clogged and generate a signal to that effect. In one embodiment the controller 200 can indicate to a user that the filter 530 needs replacement, for example.

Downstream of the filter 530 is a detector 350. The detector 350 sends signals to the controller 200 and together they form an emulsion diagnostic unit. The detector 350 detects one or more properties of the emulsion, particularly one or more quality parameters. For example, the detector 350 measures droplet size and/or droplet size distribution, for instance by scatterometry. For example, if the droplet size is not acceptable, the valve 540 can be adjusted to divert the emulsion to a drain 545. Additionally or alternatively, the controller 200 can change the proportion of base liquid and at least partly immiscible component in those embodiments where this is possible and additionally or alternatively can control a parameter of the pump 510 and/or mixer 300.

Downstream of the detector 350 is a valve 540. The valve 540 is under control of controller 200. The valve 540 can be used to divert the flow of emulsion to a drain 545 where it is collected for at least one selected from the following: disposal, recycling or storage as a pre-mix for later use (for example if the mixing is carried out apart from the lithographic apparatus). The valve 540 is activated if a measured property of the emulsion is not acceptable. For example, if one or more of the composition, temperature, droplet size or droplet size distribution falls outside a certain parameter, for example outside a predetermined parameter, the diverter valve 540 can be switched to divert the emulsion to the drain 545. The controller 200 can actuate the valve 540 to divert the emulsion to the drain 545 if, for example, the ratio of base liquid to at least partly immiscible component is not within a certain range, for example is not within a predetermined range. In an embodiment, it is permissible for the emulsion to be diverted to drain 454 without any additional safety measures being taken because the emulsion is not a harmful substance.

Optionally provided downstream of the diverter valve 540 and upstream of a bypass assembly 513 described below, there is provided a multi valve 550. The multi valve 550 allows switching between the emulsion arriving via the diverter valve 540 or between one or more alternative cleaning fluids 221, 220 which may be provided. The cleaning fluids 221, 220 may be mixed with immersion liquid, such as water, as is described in the embodiments of FIGS. 7 and 8 or may be provided neat (or they may already be premixed). A feature of the multi valve 550 is that it is mutually exclusive. That is, it only passes flow from one of the alternative cleaning fluids 220, 221 or from the valve 540. It is not possible that the multi valve 550 mixes fluids from the various sources 220, 221, 540.

The multi valve 550 is provided in an embodiment because a user of the immersion apparatus may desire to use an application specific cleaning fluid. Therefore, a user may not wish to clean with emulsion but may wish to clean with a different type of fluid and the multi valve 550 allows for this. In an embodiment the additional cleaning fluid 220, 221 may in fact be provided to the multi valve 550 through a cleaning liquid supply system 10 such as illustrated in the embodiments of FIG. 7 or 8.

Downstream of the multi valve 550 is a bypass assembly 513. The bypass assembly 513 ensures that the emulsion bypasses components of the regular liquid supply system configured to provide immersion liquid to the liquid confinement structure 12, which may otherwise be damaged by the emulsion. For example, one or more immersion liquid filters and/or heat exchangers might be damaged by the emulsion. Alternatively, it may take too long to flush emulsion out of such a component following cleaning so that it is desirable to bypass it in the first place using the bypass assembly 513. The bypass assembly 513 is similar to the bypass assembly 213 of the embodiments of FIGS. 7 and 8.

Downstream of the bypass assembly 513 and directly upstream of the liquid confinement structure 12 there is optionally provided a high frequency exciter 560. The high frequency exciter 560 further decreases the droplet size of the at least partly immiscible component. The excitation frequency may be matched to the surface tension of the at least partly immiscible component droplets, in order to make those droplets resonate/vibrate and break them into smaller droplets. For example, tubing of the high frequency exciter 560 may be excited by one or more piezo electric actuators. In one embodiment the high frequency exciter 560 is omitted.

Downstream of the high frequency exciter 560 the emulsion is provided to the liquid confinement structure 12 where it cleans the liquid confinement structure 12 in the same way as described relative to the embodiments of FIGS. 7 and 8.

In addition, the extraction rate out of the extractor 70 of the liquid confinement structure 12 may be reduced. In this way, the position at which the meniscus which extends between the porous member 110 and the surface under the liquid confinement structure 12 (such as the substrate W) moves radially outwardly with respect to the optical axis of the projection system PS. This means that the cleaning fluid which makes up the meniscus during cleaning will be in contact with all portions of the porous member 110 which are, during use, in contact with immersion liquid. That is, during cleaning the meniscus is positioned radially further outwards than during normal imaging operation. A similar effect may be used on a so-called gas drag principle fluid handling system. The underpressure to which the openings which extract liquid and gas are exposed may be reduced. The amount (i.e. flow rate) of liquid supplied to the liquid confinement structure 12 may be changed to change the position of the meniscus between the liquid confinement structure and a facing surface of, for example, the substrate W, a dummy substrate and/or a substrate table WT. The flow rate of the liquid supplied to the liquid confinement structure 12 may be changed to alter the distance between the liquid confinement structure 12 and the facing surface.

During cleaning, coalescence of droplets may be undesirable. If a droplet becomes too large or the cleaning fluid becomes a single phase cleaning fluid, all materials except for Teflon and Teflon related materials (like PFA, PTFE, ETFE, FEP, polypropylene (PP), ethylene propylene diene monomer (EPDM), Kalrez 4079 perfluoroelastomer and Kalrez 6375UP perfluoroelastomer) and stainless steel could be harmed.

In one embodiment, after cleaning, the cleaning agent is flushed away using immersion liquid to create a concentration of liquid in the system that is sufficiently low before switching on the projection beam and continuing exposure of substrates. Fifteen minutes of rinsing with immersion liquid may lead to a concentration of less than 10 ppb or less of cleaning fluid. Two hours of rinsing may lead to a concentration of less than 1 ppb.

Rinsing can be accelerated in several ways. For most materials the cleaning fluid is more stable when it sticks to a surface rather than being in emulsion (due to surface tension effects). If rinsing is performed with a third fluid which is not immersion liquid or an emulsion of immersion liquid and cleaning fluid, the rinsing can be sped up. For example, a fluid which has properties which are in between those of the immersion liquid and the cleaning emulsion may be useful. Such examples are $H_2O_2$ or a mixture of water, diethylene glycol monobutyl ether, and ethoxylated secondary C12-14-alcohol, which is generally referred to as TLDR, such as TLDR-A001 or TLDR-A001-C4 which are manufactured by Tokyo Ohko Kogyo Co., Ltd.

In an embodiment, one or more surfaces of the apparatus which come into contact with the cleaning emulsion have a coating or comprise of a material to make the surface energy high (e.g. above about 50, 60 or 70 $mJ/m^2$). For example, a quartz coating can be applied to many of the components. In an embodiment the liquid confinement structure is coated in $SiO_2$ or $TiO_2$ or surface treated stainless steel (e.g. AISI 304) is used. Surface treatment may be oxide plasma or etching bath treatment. An oxide (e.g. chromium oxide) is then formed on the surface of the steel.

Reducing or minimizing the volume in the fluid path of the emulsion in which there is no liquid circulation (also known as "dead space" of the fluid path) can reduce flushing time. The dead space may be, for example, corners and dead ends. A feature which has dead space may desirably be avoided.

Figure 11:
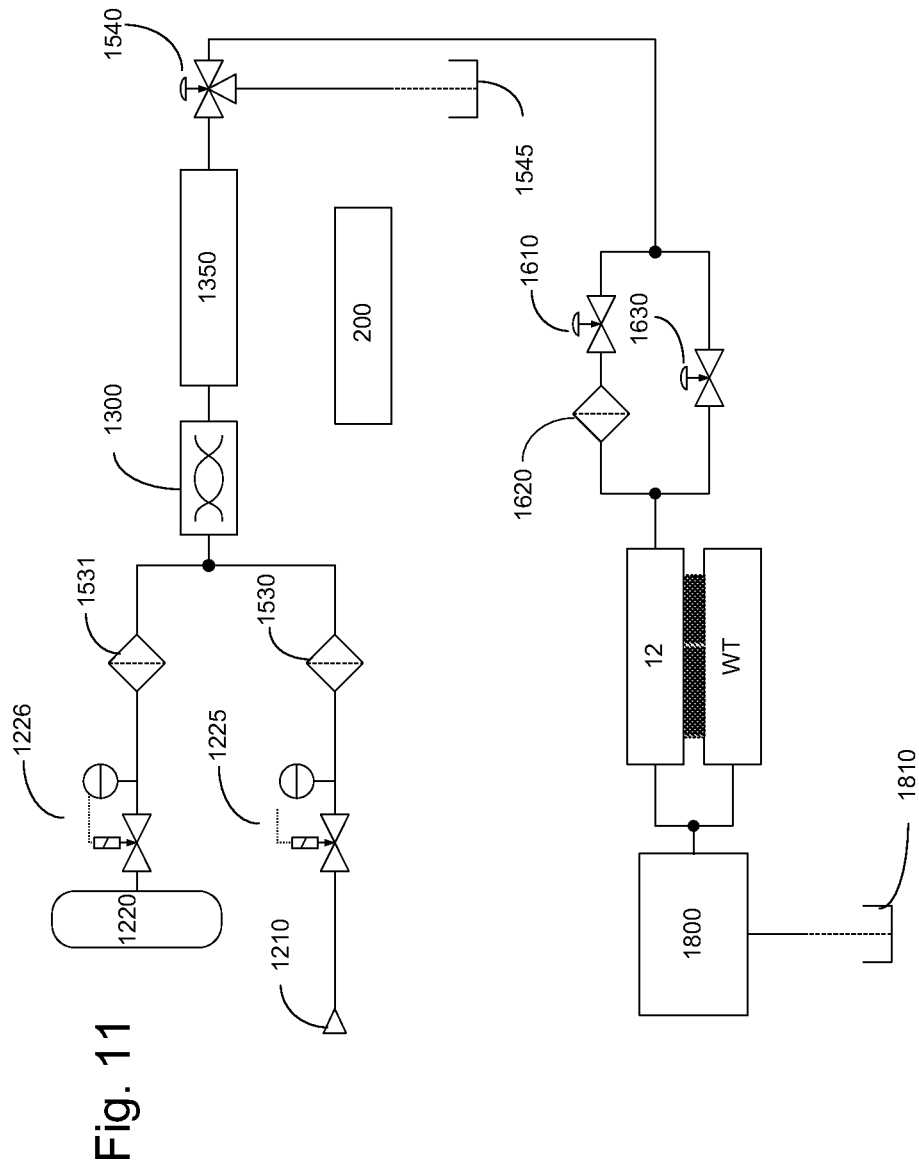
FIG. 11 depicts schematically a further embodiment of a cleaning liquid supply system.

FIG. 11 shows schematically an embodiment of a cleaning liquid supply system. This embodiment is the same as the embodiments of FIGS. 7, 8 and 10 except as described below. Any feature from the embodiment of FIG. 11 may be combined in any combination with features from the embodiments of FIGS. 7 to 10.

In the embodiment of FIG. 11 separate first and second liquid sources 1210, 1220 are provided. The first liquid source 1210 may be the source of immersion liquid (e.g. pure water) used during normal operation. The second liquid source 1220 may be the cleaning fluid which is to be emulsified in the immersion liquid.

Each liquid source 1210, 1220 has an associated regulator 1225, 1226 to regulate the flow of the respective liquid. The liquid from each source 1210, 1220 flows through a respective filter 1530, 1531 downstream of the respective regulator 1225, 1226. The filters 1530, 1531 filter only the respective liquid. Filter 1530 filters only liquid from the first liquid source 1210 and filter 1531 filters only liquid from the second liquid source 1220. This means that the filters 1530, 1531 can be optimized to filter their respective liquids. Providing separate liquid sources 1210, 1220 means that settling of an emulsion in a container is less likely to occur.

Downstream of the filters 1530, 1531 is a mixing device 1300. The mixing device 1300 may be any of the mixing devices described elsewhere herein. Downstream of the mixing device 1300 is a detector 1350. The detector 1350 sends signals to the controller 200 and together they form an emulsion diagnostic unit. The detector 1350, as for example in the embodiment of FIG. 10, may detect one or more properties of the emulsion, particularly one or more parameters indicative of the quality of the emulsion, such as composition, droplet size and/or droplet distribution.

Downstream of the detector 1350 is a valve 1540 and a chemical drain 1545. The valve 1540 and drain 1545 may operate in the same way as the valve 540 and drain 545 of the FIG. 10 embodiment.

An interconnection hose connects the valve 1540 to the main lithographic apparatus. The valve 1540 and the components upstream of the valve 1540 may be part of a cleaning emulsion generator which may be separate from the main lithographic apparatus. In an embodiment the emulsion may be generated while the interconnection hose is unconnected with a lithographic apparatus. The generated emulsion may be stored as a pre-mix.

The interconnection hose directs the emulsion to valves 1610, 1630. In normal operation, valve 1610 is left open and immersion liquid flows through that valve 1610, through filter 1620 downstream of valve 1610 and into the fluid handling structure 12. During cleaning, valve 1610 is closed so that no liquid flows through filter 1620. Instead, valve 1630 is opened such that the cleaning emulsion flows through the bypass passage in which valve 1630 is positioned. After the liquid has passed through valve 1630 it flows to the liquid handling structure 12.

The emulsion (e.g. mixed immersion liquid and cleaning liquid) flows through an opening in the immersion system, for example a surface of the liquid confinement structure 12. The liquid may flow onto a surface facing the underside of the liquid confinement structure 12. The facing surface may be a surface of a substrate table WT, for example a recess in which the substrate may be supported. The edge recess may form an opening in the surface of the substrate table WT. When supporting a substrate, the opening surrounds an edge of the substrate and to which an underpressure may applied. The emulsion may be supplied to the substrate table around the edge of the recess. The emulsion may be collected by a liquid collection system 1800 and returned to a drain 1810 or recycled, as appropriate. The collection system may have an opening for the ingress of emulsion formed in a surface of the liquid confinement structure or a surface of a component which provides a facing surface such as a substrate table.

Providing the bypass valve 1630 reduces the downtime to flush/rinse the system after cleaning has finished and before normal operation of the lithographic apparatus can be resumed.

FIGS. 12 to 17 show some embodiments of a mixer 300. These fall into several different categories. One type of mixer 300 may be a sieve as illustrated, for example, in FIG. 15. The sieve may be designed with a certain pore size to generate the correct droplet size.

The mixer 300 may mix on the basis of turbulent mixing. The mixing device may have a Reynolds number in a certain range, for example in a predetermined range. The predetermined range for the Reynolds number may be determined experimentally. For a given type of mixer 300 and a given fluid, above a certain shear rate (which may be expressed as a Reynolds number) droplets will form. The size of the droplets will decrease as the Reynolds number increases. Turbulent mixers 300 are illustrated in FIGS. 12 to 15 and 17.

Figure 16:
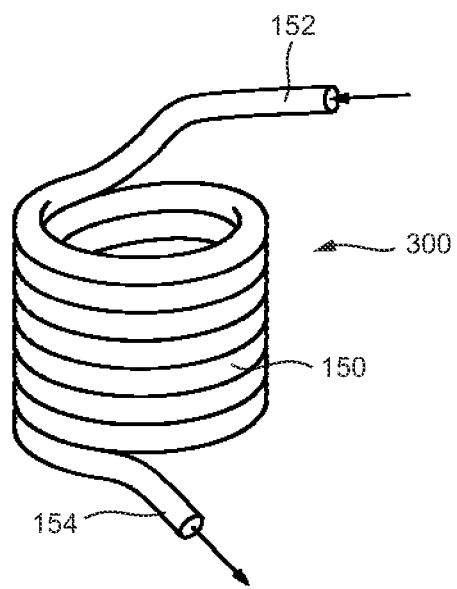
FIG. 16 schematically depicts a mixer.

A mixer 300 may be based on shear flow and such an embodiment is illustrated in FIG. 16.

In a further embodiment the mixer 300 may comprise an ultra sonic mixer. An ultra sonic transducer is placed adjacent a position where the emulsion will flow. As described above in relation to the high frequency exciter, at certain frequencies the bubbles will vibrate and thereby break into smaller droplets. The frequency of the ultra sonic mixer is chosen to be in a certain range, for example in a predetermined range, to ensure that droplets of a certain size break up.

Other types of mixers 300 include a mechanical mixer in which the fluid which is immiscible is injected by a nozzle into a flow of base fluid. The injection is of a small quantity to achieve the desired droplet size. The nozzle could for example be a piezo electric nozzle such as that used by an inkjet printer. Similarly a sparger could be used. Similarly, an extruder may be used in which an extruder includes a de-stabilizer that creates droplets out of an extruded stream of immiscible liquid. For example, a sieve could be moved in the extruded flow or the extruded flow could be agitated, for example by ultra sound.

In one embodiment the droplet size achieved at mixer 300 is smaller than the desired size to account for coalescence of droplets in the fluid path between the mixer 300 and the liquid confinement structure 12. This may result in the high frequency exciter 560 no longer being necessary.

For example FIG. 12 shows a mixing vessel 150 with an inlet 152 and an outlet 154. Protruding from walls of the mixing vessel 150 is a number of baffles 156. The baffles 156 protrude alternately from opposing walls 158 of the mixing vessel 150. Each baffle may have a sub-baffle 162 protruding from the baffle 156. In flowing through the mixing vessel 150, the mixing liquids follow a tortuous path. If the liquid flow rate is sufficiently fast, the forces applied to the liquid as it flows along tortuous path cause the liquids of the component and the base liquid to emulsify.

The mixers 300 in FIGS. 13 and 14 each have the same features as the mixer of FIG. 12. The baffles 156 of FIG. 13 are perpendicular to the walls 158 instead of being angled relative to the walls. The baffles 156 of FIGS. 13 and 14 are simple: they do not have sub-baffles 162.

In the mixer 300 shown in FIG. 15, the baffles are replaced by a plate 164 with a plurality of apertures 166. The apertures 166 between adjacent plates 164 are unaligned. The flow path for the mixing liquid is in effect a plurality of interconnected tortuous paths, the flow paths being in parallel (as opposed to being in series). In an embodiment the apertures 166 may be so small that a plate is in effect a filter. The size of the apertures depends on the size of the emulsion droplet formed by the component liquid in the base liquid. The average droplet size depends on the selected emulsion (therefore the component and the base liquids). In an embodiment the size of the apertures may be selected from the range of 1 micrometer to 1 millimeter, desirably selected from the range of 5 to 500 micrometers.

In order for the droplets to break up, the capillary number should be above the critical capillary number for a certain ratio of viscosities. For a given base and a given component, a "Grace curve" may be consulted in order to establish the necessary conditions such as shear rate. For droplet break-up in a sieve typically the ratio between droplet size and aperture size is 2-10 times depending on flow conditions and fluid viscosities. A theoretical correlation exists between the pressure drop across an aperture and the droplet size formed. A pressure drop of between 2 and 10 bar, desirably between 3 and 8 bar, in one embodiment of about 5 bar, results in a suitable droplet size.

The mixing vessel 150, and so the tortuous path for the liquid flow, may flow in three dimensions, and for example may be helical structure as shown in FIG. 16. The radius of curvature of the helical path may be sufficiently great so that the (shear) forces exerted on the mixing liquids cause them to mix as they pass through the tortuous flow path, causing the component and base liquids to emulsify.

In an embodiment, the passive mixer 300 may comprise a tortuous liquid flow path with any one or more of the features described herein.

In an embodiment use is made of the change of solubility of the component in the base with temperature. If mixing of the component and the base is performed at a high temperature, a solution of component in base can be created. Such a solution can be filtered. On cooling of that high temperature solution, an emulsion will form. The droplet size depends upon cooling rate. This embodiment may be used in combination with any other embodiment or may be used in place of the mixer 300. An apparatus incorporating this embodiment comprises a heater and a cooler, optionally with a filter downstream of the heater and upstream of the cooler.

In an embodiment the mixer may be an active mixer. However, an active mixer has a moving component. A moving component moves relative to another component in the mixer so that there is surface moving relative to another. If the relatively moving surface contacts the other a particle may be generated. Such a particle may be a source of defectivity. It is therefore desirable that a passive mixer rather than an active mixer is used as it has components which are substantially static. The risk of generating a particle is desirably reduced.

Figure 17:
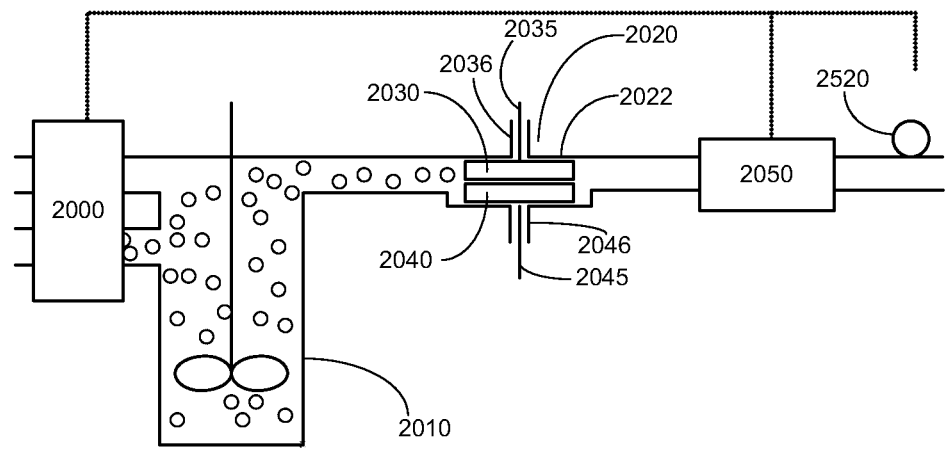
FIG. 17 schematically depicts a mixer.

FIG. 17 is a further embodiment of mixer 300. The mixer 300 of FIG. 17 is an active mixer. In the embodiment of FIG. 17 measures are taken to avoid particles caused by rubbing together of two components being provided with the emulsified liquid to the liquid confinement structure 12.

The mixer 300 of the FIG. 17 embodiment is a milling mixer. Two liquids are mixed in a coarse mixer 2010 to create a coarse emulsion. The coarse mixer 2010 may use a rotor to agitate the base and component which are provided separately. The coarse emulsion then proceeds to a fine mixer 2020. Here the coarse emulsion passes between two rotors 2030, 2040. Both rotors 2030, 2040 may be rotating or one may be stationary with respect to the housing 2022. The moving rotors are supported by respective shafts 2035, 2045. Particles may be generated between the shafts 2035, 2045 and the housing 2022 in which the shafts are housed. In order to prevent any such particles from being supplied to the fluid handling structure 12, fluid is flushed past the area where the drive shafts 2035, 2045 contact and move relative to a respective supporting tube 2036, 2046 surrounding the respective shafts 2035, 2045. The fluid is then diverted from a path to the fluid handling structure to, e.g., a drain. In this way particles generated are flushed away with the emulsion passing through the tubes 2036, 2046.

In an embodiment of FIG. 17 the temperature of the emulsion is also carefully controlled. A temperature sensor 2520 passes signals to a cooler 2000 positioned upstream of a heater 2050. The cooler 2000 may be positioned upstream of the coarse mixer 2010, either before or after the base and component have been mixed. The heater 2050 is positioned downstream of the fine mixer 2020 and upstream of the temperature sensor 2520. During mixing in the coarse mixer 2010 and in the fine mixer 2020, the temperature of the emulsion will increase. The cooler 2000 cools the emulsion enough so that the temperature of the emulsion upstream of the heater 2050 is below the desired value. The heater 2050 then heats the emulsion to the target value. This embodiment also works with only one mixer and can be added to any other embodiment.

In one embodiment the mixer 300 comprises a high shear mixer in which one rotor moves relative to another rotor. Suitable mixers are available commercially from IKA Wilmington, N.C., USA under the trade mark Turrax.

Figure 18:
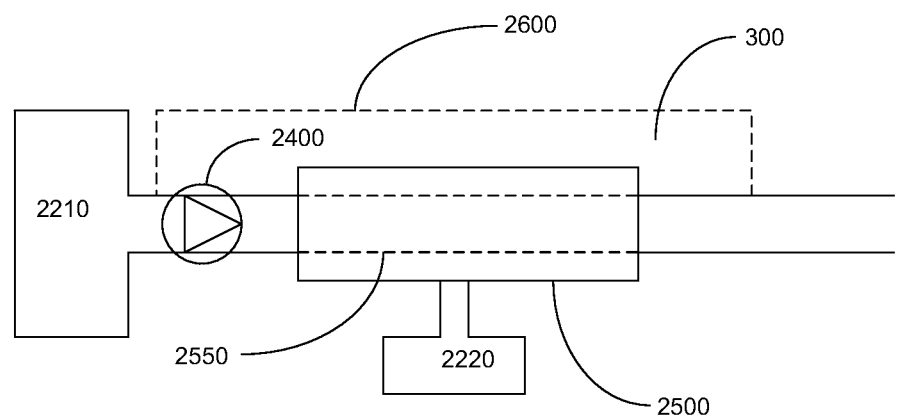
FIG. 18 schematically depicts a mixer.

A further embodiment of mixer 300 is illustrated in FIG. 18. Base from a first liquid source 2210 is forced through a chamber 2500 by a pump 2400. The base is confined to a central part of the chamber 2500 by a membrane 2550. Liquid from the second source 2220 (i.e. the component) is introduced into the radially outer part of the chamber 2500 radially outwardly of the membrane 2550. The component is introduced at a pressure and the component thereby passes through the membrane 2550 to form an emulsion in the base inside the membrane 2550. The emulsion exits the chamber 2500. If more component is to be dispersed in the base, a recycling path 2600 may be employed whereby emulsion downstream of the chamber 2500 is recycled again through the chamber 2500 (with appropriate valves, if necessary) so that more component may be introduced through the membrane 2550.

Illustrated in FIGS. 8 and 10 are embodiments of how to control the additive, e.g. the component liquid, concentration. This may be achieved by providing a detector (or sensor) 350, 351 to detect the proportion of the component liquid in the emulsion at a desired location. A sensor may be used to monitor the state of the emulsion at any location in the supply path between leaving the mixer in the cleaning liquid supply system to supply to the immersion system. Possible locations of a detector 350 may be between the mixer 300 and the liquid conditioner 242 (or immediately downstream of the filter 530 in the case of the FIG. 10 embodiment), in the liquid conditioner 242, between the liquid conditioner and the liquid confinement structure, such as in the liquid confinement structure 12, just downstream of the liquid conditioner, or just upstream of the liquid confinement structure 12.

In any of these cases results of a signal from at least one of the detector(s) 350, 351 is sent to the controller 200. In response to the signal, the controller 200 adjusts the quantity (i.e. rate of supply) of the base liquid, the component liquid, or both, which is introduced into the flow path just before or at the inlet 152 of the mixer 300. A single sensor may be sufficient in the supply path, for example, as the emulsion leaves the cleaning liquid supply system 10 or as the emulsion is supplied to the immersion system. In an embodiment, the sensor is located in a confinement structure 12.

A sensor located in the cleaning liquid supply system would be able to detect the effectiveness of the mixing in the mixer. Such a sensor connected, for example via a control unit, to the mixing control device may be provided with feedback sufficiently quickly to ensure the emulsion is within the desired working range.

A sensor located in or near the immersion system, for example the liquid confinement structure 12, would detect the state of the emulsion just before it is used. If the emulsion is outside the desired working range, a signal may be directed to an appropriate control device within the cleaning liquid supply system 10. The control device may control the cleaning liquid supply system to ensure that one or more parameters are altered so that the emulsion supplied to the immersion system returns to its working range. However, as the sensor is located far downstream in the supply path, the feedback time may be long, perhaps too long.

It may seem that it is desirable to have the sensor close to or in the cleaning liquid supply system 10. However, the conditions of the emulsion can change as the emulsion travels along the supply path. It is therefore desirable to have a sensor located in or close to the cleaning liquid supply system. However such a sensor cannot detect the state of the emulsion as it is supplied to the immersion system. It is desirable to have a sensor located near to the immersion system to detect the state of the emulsion as it is supplied to the immersion system.

Figure 19:
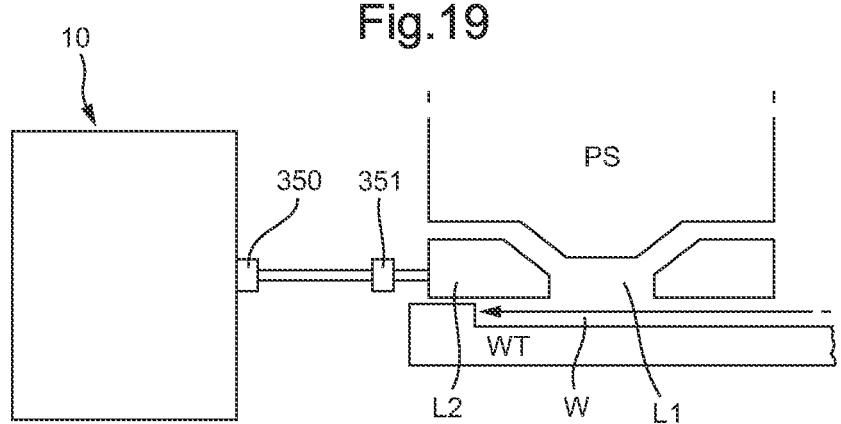
FIG. 19 schematically shows a fluid supply system and a part of a lithographic tool.

In an embodiment, there may be two sensors: one located upstream of the other, as shown in FIG. 19. One of the sensors may be located in or close to the cleaning liquid supply system 10; one of the sensors may be located in or close to the immersion system.

FIG. 19 shows a schematic representation of the interconnection of the cleaning liquid supply system 10 and the immersion system, including a liquid confinement structure 12. Interconnecting the immersion system and the cleaning liquid supply system is a flow path with two sensors 350, 351, although only one sensor may be present. Note that the location of the sensor 350 is at any position downstream of a mixer 300. Therefore a conditioner 242 (e.g. such as that described in relation to FIGS. 7 and 8) or other component including those illustrated downstream of the detector 350 in FIG. 10 may be located downstream of the sensor 350, but is not shown in FIG. 19. Although it is not shown, there may be second flow path 213, 245 for immersion liquid to flow in parallel with the cleaning flow path to the immersion system.

In an embodiment, both sensors 350, 351 are present. In using such a system the signals from the two sensors may be compared. In comparing the signals, the stability of the emulsion may be determined. In measuring the stability of the emulsion, the cleaning liquid control system may be controlled so as to ensure that the emulsion is stable: so that the signal from each of the sensors is substantially consistent at certain point of time, or for the same volume of liquid as passes each sensor 350, 351, for example at the end and the beginning of the flow path, or both.

The sensor 350, 351 may detect a physical property of the emulsion indicative of the state of the emulsion. The physical property may be the proportion by volume of the component. To detect this, the sensor may be a flow sensor, detecting the flow rate of the droplets of liquid component in the base liquid. A suitable sensing technique which may be used by the sensor include (in a non-limiting list): a sonic flow meter which uses, for example, an ultrasound frequency (e.g. an ultrasound sensor), dynamic radiation (e.g., light) scattering and/or optical transmission sensing. The flow meter may apply the Doppler effect.

In an embodiment, the sensor, such as an ultrasonic flow meter, is calibrated to adjust for the measured fluid's acoustic properties. For this purpose the sensor is zeroed containing a reference fluid, desirably the emulsion which is to be sensed by the sensor. The sensor is thus calibrated using the desired cleaning emulsion. Having been calibrated, the deviation in measured flow compared to the sum of the known flow velocity of the base liquid (for example water as ultra pure water) and the component liquid, is an indication of whether the emulsion has the desired property.

In an embodiment, a sonic flow sensor may be located on the flow path as shown in FIG. 20. The sensor comprises two sensor units 168. Each sensor unit 168 is placed at the side of the flow path, but offset from each other in the flow direction 170. In an embodiment the sensor units 168 are located on different sides of the flow path. One sensor unit may be located further downstream in the flow path than the other. At least one of the sensor units 168 is a sonic transducer; and at least one of the sensor units 168 is a sonic receiver operating in the same frequency range as the sonic transducer. In an embodiment the at least one of the sensor units 168 is a transceiver which can both emit and receive sonic signals.

An emitting sensor unit 168 emits a signal 172 which travels along the path and possibly across the flow path towards a receiving sensor unit 168. As the signal 172 travels through the cleaning liquid, it travels through the component liquid in the form of a number of droplets 174 and the base liquid 176 in which the droplets 174 are suspended. The physical properties of the component liquid in the droplets form and the base liquid are different, thus affecting the speed of the sonic signal. By measuring the change in frequency (i.e. the effect of the Doppler effect on the signal) as compared to pure base liquid 176 flowing through the flow path (desirably under the same conditions e.g. temperature, pressure and flow rate), the proportions of the component liquid and the base liquid in the cleaning liquid may be determined.

The sonic signal may contain additional information about the number density of the droplets and/or the average size of the droplets. By directing the signal from a receiving sensor to a processor, this information may be encoded in the sonic signal detected. The additional information may provide further information about the stability of the cleaning liquid. Stability may relate to the size and/or number density of the droplets in the cleaning liquid as well as the proportion of cleaning liquid which is component liquid.

In an embodiment an optical sensor may be used. A suitable optical sensor is described in 'A Novel Fiber-Optic Photometer for In Situ Stability Assessment of Concentrated Oil-in-Water Emulsions', Susen Oliczewski and Rolf Daniels, AAPS PharmSciTech 2007; 8 (3) Article 70, Aug. 31, 2007, which is incorporated herein its entirety by reference. The technique described therein is suited to determine changes in instability of dilute emulsions of a polar liquid and non-polar liquid, such as water (or an aqueous solution) and an oil. The technique enables time resolved transmissivity of transparent and opaque dispersions to be measured. The optical density of a dispersed system such as an emulsion may be indication of its stability. The sensor arrangement includes a fiber optic photometer to measure the radiation transmission through an emulsion flow. There is a reduction in transmitted radiation intensity due to absorption and scattering from, for example, droplets of liquid component. Radiation, such as a pulsed laser light or other radiation source which emits at a single wavelength, is directed through the liquid flow and is received by a detector, the radiation intensity being set such that it exceeds a threshold level at the detector. This serves as a reference value. The detected intensity of the radiation is proportional to the optical density of the sample and is therefore related to the droplet size distribution. Therefore by comparing two different optical sensors or comparing the detected signal relative to a threshold value, a property of the emulsion, such as its stability (e.g. change in a measured property over time) may be observed. By monitoring a signal detecting the transmitted and/or scattered radiation over time, variations in stability of the emulsion may be monitored.

In an embodiment, the optical sensor comprises an emitter and detector. The optical sensor 350, 351 may be located in or near the cleaning fluid supply system 10, in or near the liquid confinement structure 12, or at both locations.

An embodiment of the optical sensor may be arranged as shown in FIG. 21. The optical sensor has an emitter 180 and a detector 182, 183, 184. The detector may be a transmission detector or a scatter detector. The scatter detector may operate as a diffraction detector. The scatter detector may operate as a laser scatterometer. The scatter detector can be used to determine droplet size. With knowledge of the refractive index of both phases, droplet size distributions can be determined using Fraunhofer and Mie theory. The emitter may be connected by optic fiber to a radiation source (not shown) such as a laser, or light emitting diode. The emitter 180 emits an optical signal through the flow 170 of emulsion 174, 176. The transmission detector 182 may be located to detect the optical signal transmitted through the emulsion. The transmission detector 182 may be located on the opposite side of the flow from the emitter 180 at a known distance, so it is configured to detect the radiation 186 directed straight through the emulsion. For scattering, the scattering detector 183, 184 is not directly opposite to the emitter 180, for example it may be placed at a position staggered relative to the emitter 182. It may be placed adjacent the emitter 180. The scatter detector detects radiation scattered by the droplets 174 as shown by arrows 189, 190.

Turbidity probes are commercially available which measure light that is able to pass through a sample. The measurements are based on the degree of attenuation and can be used to measure the fraction of cleaning liquid.

In an embodiment the optical sensor 350, 351, 1350 may use broadband infrared (or UV) and check absorption. The droplet size distribution can be calculated from the different absorptions at different wavelengths. Alternatively or additionally the sensor 350, 351, 1350 may be an ultrasonic detector and/or a current sensor. A current sensor is not capable of measuring droplet size, but can give information about the amount of component dissolved in the base.

In one embodiment a safety feature is provided to stop supply of emulsion to the liquid confinement structure if the liquid component in the emulsion is detected to be too high. For this a detector 350, 351 may be provided in the liquid flow path before the emulsion is supplied to the immersion system.

Although a cleaning fluid supply described herein is attached to, connected or a part of a lithographic apparatus, in an embodiment the cleaning fluid supply system is a separate device. Instead of supplying liquid directly to an immersion system of a lithographic apparatus, the emulsion may be directed to a storage container to store a pre-mixed emulsion. The pre-mixed emulsion may be supplied to a lithographic apparatus for cleaning an immersion system, if the emulsion has sufficient stability, without the need for mixing immediately before supply. Such an arrangement may have a sensor (as described herein) to detect at least one parameter indicative of the quality of the emulsion, such as its stability.

In an embodiment, there is provided an immersion lithographic apparatus comprising: a projection system; a liquid confinement structure configured at least partly to confine immersion liquid to an immersion space defined by the projection system, the liquid confinement structure and a substrate and/or substrate table; a liquid supply device comprising a mixer configured to mix liquid from a first liquid source with an active cleaning agent liquid from a second liquid source to form an emulsified cleaning fluid, and a conduit configured to provide emulsified cleaning fluid from the mixer to the liquid confinement structure, the emulsified cleaning fluid comprising at least a first liquid component and a second liquid component; a sensor system configured to sense a property of the emulsified cleaning fluid; and a controller configured to control the supply of liquid from the first liquid source and/or the second liquid source to the mixer in order to control a property of the emulsified cleaning fluid.

In an embodiment, the sensor system may be configured to sense a change in the property over time of the emulsified cleaning fluid. The sensor system may comprise at least two sensors, one located upstream of the other, the sensors being connected to the controller and to direct a signal to the controller, the controller configured to process the signals from the sensors. The sensor system may be configured to sense the flow rate of the first liquid component in the emulsified cleaning fluid, relative to the flow of the second liquid component. The sensor system may be configured to detect the proportion of the first liquid component relative to the second liquid component in the emulsified cleaning fluid. The sensor system may be configured to transmit and receive ultrasound signals through a flow path of the emulsified cleaning fluid.

In an embodiment, the controller may be further configured to control an operating condition of the liquid supply device. The liquid of the first liquid source may comprise ultra pure water. The liquid of the second liquid source may comprise a cleaner, desirably a resist cleaner, such as a cleaning liquid to remove topcoatless resist.

In an embodiment, the mixer may comprise a valve to meter liquid from one liquid source into liquid of another liquid source. The mixer may further comprise a first reservoir in fluid communication with the first liquid source and the second liquid source. The mixer may comprise a further reservoir in fluid communication with the first reservoir and the first liquid source.

In an embodiment, the controller is configured to control a valve to meter liquid into the reservoir(s). The controller may be configured to measure a concentration of liquid from the second liquid source in the emulsified cleaning fluid provided to the liquid confinement structure and to control mixing on the basis of the measurement in a feed-back manner, using a signal provided from the sensor system.

In an embodiment, the conduit is configured to provide emulsified cleaning fluid to an opening in a surface of the liquid confinement structure which faces the substrate and/or substrate table. In an embodiment, the immersion lithographic apparatus may further comprise a substrate, wherein the substrate has a surface coating of resist. The resist may be a topcoatless resist. The substrate may have a topcoat on the resist and/or a bottom anti-reflection coating under the resist.

In an embodiment, there is provided a fluid supply apparatus configured to supply an emulsified cleaning fluid to an immersion lithographic apparatus, the fluid supply apparatus comprising a mixer configured to mix an additive fluid from an additive fluid supply and an immersion liquid from an immersion liquid supply to form the emulsified cleaning fluid, a sensor system configured to sense a physical property of the emulsified cleaning fluid and a controller connected to the sensor and the mixer, the controller configured to control: supply of the additive fluid from the additive fluid supply to the mixer; and a physical property of the emulsified cleaning fluid. The controller may be configured to control supply of immersion liquid from the immersion liquid supply in parallel to supply of the emulsified cleaning fluid.

In an embodiment, there is provided a fluid supply apparatus configured to supply a cleaning emulsion fluid to an immersion lithographic apparatus, the fluid supply apparatus comprising a mixer configured to mix a cleaning component and a base liquid to provide the cleaning emulsion fluid, a sensor configured to sense a concentration of the proportion of the cleaning component in the cleaning emulsion fluid and a controller connected to the sensor and the mixer, the controller configured to control: supply of the cleaning component to the mixer; and the concentration of the cleaning component in the cleaning emulsion fluid.

In an embodiment, there is provided an immersion lithographic apparatus comprising: a liquid supply device comprising a mixer configured to mix a first liquid with an active cleaning agent liquid to form an emulsified cleaning fluid in which the mixer is a passive mixer configured to maintain a droplet size of the active cleaning agent liquid to be within a certain range. The mixer may comprise a mixing vessel with a plurality of baffles protruding into the vessel from a side wall of the vessel. At least one of the plurality of baffles may comprise an associated sub-baffle protruding from its associated baffle. The mixer may be configured to force liquid flowing through it to follow a tortuous path. The mixer may comprise a filter through which the first liquid and the active cleaning agent liquid are forced to form an emulsion with the desired droplet size. The mixer may be configured to force liquid to flow in a helical path such that the desired droplet size is achieved due to shear forces.

In an embodiment, there is provided an immersion lithographic apparatus comprising: a liquid confinement structure configured at least partly to confine immersion liquid to an immersion space defined by a projection system, the liquid confinement structure and a substrate and/or substrate table; and a liquid supply device configured to supply an emulsified cleaning fluid to the liquid confinement structure, the liquid supply device comprising a high frequency exciter upstream of the liquid confinement structure. A frequency of the high frequency exciter may be adapted to vibrate droplets of an active cleaning agent liquid in the emulsified cleaning fluid to break up droplets of the active cleaning agent liquid.

In an embodiment, there is provided a an immersion lithographic apparatus comprising: a liquid confinement structure configured at least partly to confine immersion liquid to an immersion space defined between a projection system, the liquid confinement structure and a substrate and/or substrate table; a liquid supply device configured to supply a cleaning agent to the liquid confinement structure; and a controller configured to control the liquid supply device and to adjust operating conditions of the liquid confinement structure during cleaning such that the space is increased in size in a radial direction with respect to an optical axis of the projection system during cleaning compared to imaging operation. The controller may be configured to reduce an extraction under pressure of an extractor of the liquid confinement structure during cleaning compared to the extraction under pressure used during imaging operation.

In an embodiment, there is provided an immersion lithographic apparatus comprising: a liquid supply device configured to supply an emulsified cleaning fluid to a component to be cleaned, wherein the liquid supply device is configured such that first and second liquids are pushed through a mixer configured to mix the first and second liquids to form the emulsified cleaning fluid and to the component to be cleaned. The liquid supply device may comprise a pump upstream of the mixer to push the first and second liquids through the mixer. The first and second liquids may be provided in a pressurized vessel, the pressure in the vessel being effective to push the first and second liquids through the mixer and to the liquid confinement structure.

In an embodiment, there is provided an immersion lithographic apparatus comprising: a liquid supply device comprising a mechanical mixer to mix immersion liquid with a cleaning fluid to form an emulsion for provision to a liquid confinement structure, wherein immersion liquid and/or cleaning fluid and/or emulsion is flushed past an area where two surfaces of the mixer which move relative to each other are in contact and diverted from a path to the liquid confinement structure.

In an embodiment, there is provided an immersion lithographic apparatus comprising: a liquid supply device comprising a mechanical mixer to mix immersion liquid and a cleaning fluid to form an emulsified cleaning fluid, a cooler upstream of the mixer to cool immersion liquid and/or cleaning fluid and/or emulsified cleaning fluid, and a heater downstream of the mixer to heat emulsified cleaning fluid to a certain temperature. The immersion lithographic apparatus may further comprise a temperature sensor to measure a temperature of the emulsified cleaning fluid downstream of the heater. The immersion lithographic apparatus may further comprise a controller to control the cooling of the cooler and the heating of the heater to ensure that the temperature sensed by the sensor is a certain temperature.

In an embodiment, there is provided an immersion lithographic apparatus comprising: a liquid confinement structure configured at least partly to confine immersion liquid to an immersion space defined between a projection system, the liquid confinement structure and a substrate and/or substrate table, wherein a surface of the liquid confinement structure which, during cleaning, will come in contact with cleaning liquid has a surface energy of above 50 mJ/m$^2$.

In an embodiment, there is provided a method of cleaning an immersion lithographic apparatus comprising passing an emulsion of immersion liquid and a cleaning fluid over a surface to be cleaned, rinsing the surface to be cleaned with a rinsing fluid different to the cleaning fluid and different to the immersion liquid, and reintroducing the immersion liquid onto the clean surface. The rinsing fluid may be TLDR or $H_2O_2$.

In an embodiment, there is provided an immersion lithographic apparatus comprising: a liquid supply device comprising a mixer configured to mix a first liquid with an active cleaning agent liquid to form an emulsified cleaning fluid in which the active cleaning agent liquid is introduced into the first liquid through a membrane.

In an embodiment, there is provided an immersion lithographic apparatus comprising: a liquid supply device comprising a heater to heat a mixed first liquid with an active cleaning agent to dissolve the active cleaning agent in the first liquid, and a cooler to cool the first liquid with dissolved active cleaning agent to form an emulsified cleaning fluid. The immersion lithographic apparatus may further comprise a controller to control the rate of cooling of the cooler to determine a droplet size in the emulsified cleaning fluid to be within a certain range. The liquid supply device may further comprise a filter upstream of the cooler and downstream of the heater to filter the first liquid in which the active cleaning agent is dissolved.

In an embodiment, there is provided an immersion lithographic apparatus comprising: a projection system; a liquid confinement structure configured at least partly to confine immersion liquid to an immersion space defined by the projection system, the liquid confinement structure and a substrate and/or substrate table; a liquid supply device comprising a conduit configured to provide emulsified cleaning fluid from an emulsified cleaning liquid fluid to the immersion space, the emulsified cleaning fluid comprising at least a first liquid component and a second liquid component; a sensor system configured to sense a property of the emulsified cleaning fluid; and a controller configured to control the supply of emulsified cleaning fluid to the immersion space.

In an embodiment, there is provided a liquid supply device comprising: a mixer configured to mix liquid from a first liquid source with an active cleaning agent liquid from a second liquid source to form an emulsified cleaning fluid; a conduit configured to provide emulsified cleaning fluid from the mixer, the emulsified cleaning fluid comprising at least a first liquid component and a second liquid component; a sensor system configured to sense a property of the emulsified cleaning fluid; and a controller configured to control the supply of liquid from the first liquid source and/or the second liquid source to the mixer in order to control a property of the emulsified cleaning fluid. The conduit may be arranged to supply the emulsified cleaning fluid to an immersion space or a storage container.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

Controllers described above may have any suitable configuration for receiving, processing, and sending signals. For example, each controller may include one or more processors for executing the computer programs that include machine-readable instructions for the methods described above. The controllers may include data storage medium for storing such computer programs, and/or hardware to receive such medium.

One or more embodiments of the invention may be applied to any immersion lithography apparatus, in particular, but not exclusively, those types mentioned above, whether the immersion liquid is provided in the form of a bath, only on a localized surface area of the substrate, or is unconfined on the substrate and/or substrate table. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

Moreover, although this invention has been disclosed in the context of certain embodiments and examples, it will be understood by those skilled in the art that the present invention extends beyond the specifically disclosed embodiments to other alternative embodiments and/or uses of the invention and obvious modifications and equivalents thereof. In addition, while a number of variations of the invention have been shown and described in detail, other modifications, which are within the scope of this invention, will be readily apparent to those of skill in the art based upon this disclosure. For example, it is contemplated that various combination or sub-combinations of the specific features and aspects of the embodiments may be made and still fall within the scope of the invention. Accordingly, it should be understood that various features and aspects of the disclosed embodiments can be combined with or substituted for one another in order to form varying modes of the disclosed invention. Thus, it is intended that the scope of the present invention herein disclosed should not be limited by the particular disclosed embodiments described above, but should be determined only by a fair reading of the claims that follow.

The descriptions above are intended to be illustrative, not limiting. Thus, it will be apparent to one skilled in the art that modifications may be made to the invention as described without departing from the scope of the claims set out below.

The invention claimed is:

1. An immersion lithographic apparatus comprising:
   a projection system;
   a liquid confinement structure configured at least partly to confine immersion liquid to an immersion space defined by the projection system, the liquid confinement structure and a substrate and/or substrate table;
   a liquid supply device comprising a mixer configured to mix liquid from a first liquid source with an active cleaning agent liquid from a second liquid source to form an emulsified cleaning fluid, and a conduit configured to provide emulsified cleaning fluid from the mixer to the liquid confinement structure, the emulsified cleaning fluid comprising at least a first liquid component and a second liquid component;
   a sensor system configured to sense a property of the emulsified cleaning fluid; and
   a controller configured to control the supply of liquid from the first liquid source and/or the second liquid source to the mixer in order to control a property of the emulsified cleaning fluid.

2. The immersion lithographic apparatus of claim 1, wherein the sensor system is configured to sense a change in the property over time of the emulsified cleaning fluid.

3. The immersion lithographic apparatus of claim 1, wherein the sensor system comprises at least two sensors, one located upstream of the other, the sensors being connected to the controller and to direct a signal to the controller, the controller configured to process the signals from the sensors.

4. The immersion lithographic apparatus of claim 1, wherein the sensor system is configured to sense the flow rate of the first liquid component in the emulsified cleaning fluid, relative to the flow of the second liquid component.

5. The immersion lithographic apparatus of claim 4, wherein the sensor system is configured to transmit and receive ultrasound signals through a flow path of the emulsified cleaning fluid.

6. The immersion lithographic apparatus of claim 1, wherein the sensor system is configured to detect the proportion of the first liquid component relative to the second liquid component in the emulsified cleaning fluid.

7. The immersion lithographic apparatus of claim 1, wherein the controller is further configured to control an operating condition of the liquid supply device.

8. The immersion lithographic apparatus of claim 1, wherein the liquid of the first liquid source comprises ultra pure water.

9. The immersion lithographic apparatus of claim 1, wherein the liquid of the second liquid source comprises a resist cleaner.

10. The immersion lithographic apparatus of claim 1, wherein the mixer comprises a valve to meter liquid from one liquid source into liquid of another liquid source.

11. The immersion lithographic apparatus of claim 1, wherein the mixer further comprises a first reservoir in fluid communication with the first liquid source and the second liquid source.

12. The immersion lithographic apparatus of claim 1, wherein the controller is configured to measure a concentration of liquid from the second liquid source in the emulsified cleaning fluid provided to the liquid confinement structure and to control mixing on the basis of the measurement in a feed-back manner, using a signal provided from the sensor system.

13. The immersion lithographic apparatus of claim 1, wherein the conduit is configured to provide emulsified cleaning fluid to an opening in a surface of the liquid confinement structure which faces the substrate and/or substrate table.

14. The immersion lithographic apparatus of claim 1, further comprising a substrate, wherein the substrate has a surface coating of resist.

15. The immersion lithographic apparatus of claim 14, wherein the resist is a topcoatless resist.

16. The immersion lithographic apparatus of claim 14, wherein the substrate has a topcoat on the resist and/or a bottom anti-reflection coating under the resist.

17. A fluid supply apparatus configured to supply an emulsified cleaning fluid to an immersion lithographic apparatus, the fluid supply apparatus comprising a mixer configured to mix an additive fluid from an additive fluid supply and an immersion liquid from an immersion liquid supply to form the emulsified cleaning fluid, a sensor system configured to sense a physical property of the emulsified cleaning fluid and a controller connected to the sensor and the mixer, the controller configured to control:
   supply of the additive fluid from the additive fluid supply to the mixer; and
   a physical property of the emulsified cleaning fluid.

18. The fluid supply apparatus of claim 17, wherein the controller is configured to control supply of immersion liquid from the immersion liquid supply in parallel to supply of the emulsified cleaning fluid.

19. A liquid supply device comprising:
- a mixer configured to mix liquid from a first liquid source with an active cleaning agent liquid from a second liquid source to form an emulsified cleaning fluid;
- a conduit configured to provide emulsified cleaning fluid from the mixer, the emulsified cleaning fluid comprising at least a first liquid component and a second liquid component;
- a sensor system configured to sense a property of the emulsified cleaning fluid; and
- a controller configured to control the supply of liquid from the first liquid source and/or the second liquid source to the mixer in order to control a property of the emulsified cleaning fluid.

20. The liquid supply device of claim 19, wherein the conduit is arranged to supply the emulsified cleaning fluid to an immersion space or a storage container.

* * * * *